US011128226B2

(12) United States Patent
Yabuuchi

(10) Patent No.: US 11,128,226 B2
(45) Date of Patent: Sep. 21, 2021

(54) POWER CONVERSION DEVICE

(71) Applicant: Mitsubishi Electric Corporation, Tokyo (JP)

(72) Inventor: Naoya Yabuuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 25 days.

(21) Appl. No.: 16/616,715

(22) PCT Filed: Oct. 18, 2017

(86) PCT No.: PCT/JP2017/037715
§ 371 (c)(1),
(2) Date: Nov. 25, 2019

(87) PCT Pub. No.: WO2019/008788
PCT Pub. Date: Jan. 10, 2019

(65) Prior Publication Data
US 2021/0175816 A1    Jun. 10, 2021

(30) Foreign Application Priority Data
Jul. 4, 2017    (JP) .............................. JP2017-131035

(51) Int. Cl.
*H02M 3/335*    (2006.01)
*H02M 3/00*    (2006.01)
(Continued)

(52) U.S. Cl.
CPC ........ *H02M 3/33592* (2013.01); *H01F 27/32* (2013.01); *H02M 3/003* (2021.05);
(Continued)

(58) Field of Classification Search
CPC ......... H02M 3/33592; H02M 3/33523; H02M 7/003; H02M 3/003; H01F 27/32; H05K 1/0306
See application file for complete search history.

(56) References Cited

U.S. PATENT DOCUMENTS

| 5,986,912 A | 11/1999 | Hsiao et al. |
| 2014/0063860 A1* | 3/2014 | Suzuki ................... H02M 1/36 363/17 |

(Continued)

FOREIGN PATENT DOCUMENTS

| EP | 1 976 104 A2 | 10/2008 |
| JP | 07-203686 A | 8/1995 |

(Continued)

OTHER PUBLICATIONS

International Search Report of PCT/JP2017/037715 dated Dec. 12, 2017.

(Continued)

*Primary Examiner* — Jue Zhang
(74) *Attorney, Agent, or Firm* — Sughrue Mion, PLLC; Richard C. Turner

(57) ABSTRACT

Provided is a power conversion device including: an isolation transformer (107) including a first winding and a second winding; switching elements (101 to 104) to be connected to the first winding of the isolation transformer (107); a first conductor (105) configured to connect one end of the first winding of the isolation transformer (107) to the switching elements (101 and 102); and a second conductor (106) configured to connect another end of the first winding of the isolation transformer (107) to the switching elements (103 and 104), the first conductor (105) and the second conductor (106) being arranged on an insulating substrate (301) so as to be parallel to each other so that the first conductor (105) and the second conductor (106) are prevented from overlapping each other.

10 Claims, 23 Drawing Sheets

(51) Int. Cl.
   *H05K 1/03*     (2006.01)
   *H01F 27/32*    (2006.01)
   *H02M 7/00*     (2006.01)
(52) U.S. Cl.
   CPC ....... *H02M 3/33523* (2013.01); *H02M 7/003* (2013.01); *H05K 1/0306* (2013.01)

(56) References Cited

U.S. PATENT DOCUMENTS

2015/0078042 A1    3/2015  Standing
2017/0179834 A1    6/2017  Lin
2017/0372834 A1*  12/2017  Kawada .................. H01F 30/10

FOREIGN PATENT DOCUMENTS

JP   2013-055781 A   3/2013
JP   2016-207894 A   12/2016
WO   2015/190424 A1  12/2015

OTHER PUBLICATIONS

Extended European Search Report dated Jun. 15, 2020 in European Application No. 17917172.3.

* cited by examiner

POWER CONVERSION DEVICE

CROSS REFERENCE TO RELATED APPLICATIONS

This application is a National Stage of International Application No. PCT/JP2017/037715 filed Oct. 18, 2017, claiming priority based on Japanese Patent Application No. 2017-131035 filed Jul. 4, 2017.

TECHNICAL FIELD

The present invention relates to a power conversion device, and more particularly, to a power conversion device including semiconductor switching elements and an isolation transformer.

BACKGROUND ART

Electric vehicles and hybrid vehicles include, similarly to motor vehicles powered by an engine, an auxiliary battery for a control circuit configured to operate electrical components. However, electric vehicles have no engine as a drive source, and hence, as a matter of course, an alternator to be driven by an engine cannot be used. Further, hybrid vehicles employ a start-stop system (system for automatically stopping the engine when the vehicle is stopped, for example, when the vehicle waits for a traffic light at an intersection) in order to improve fuel efficiency and reduce exhaust gas, and hence, also in this case, an alternator cannot be used. Therefore, electric vehicles and hybrid vehicles require a step-down converter or other power conversion devices for supplying the auxiliary battery with energy of a drive battery configured to operate a travel motor.

As such a step-down converter, a full-bridge converter circuit is generally used. Switching elements and an isolation transformer are used, and the switching elements are controlled through an on/off operation so that the energy of the drive battery is supplied to the auxiliary battery via the isolation transformer.

In this case, in a case of turning off the switching elements, when a wiring inductance component is large, a surge voltage may be increased, and the surge voltage may damage the switching elements.

In view of this, in order to suppress the surge voltage, for example, a power conversion device proposed in Patent Literature 1 employs the following configuration. Two conductors through which currents flow in opposite directions are formed of wide conductor plates, and the conductor plates are brought close to each other. In this manner, the inductance of the wiring conductor is reduced, and the surge voltage is suppressed.

CITATION LIST

Patent Literature

[PTL 1] JP 07-203686 A

SUMMARY OF INVENTION

Technical Problem

However, in the power conversion device of Patent Literature 1, wide conductor plates are required to be used in the circuit configuration in order to reduce the inductance. As a result, there has inevitably been a problem in that the mounting area is increased, and thus downsizing becomes difficult. Further, insulating performance cannot be ensured when the wide conductor plates are brought close to each other. Therefore, there has been a problem in that, when the insulating performance is to be ensured, the inductance cannot be sufficiently decreased.

The present invention has been made to solve the above-mentioned problems, and has an object to provide a power conversion device capable of suppressing a surge voltage to be generated at the time of an operation of turning off switching elements, while achieving downsizing and ensuring insulating performance.

Solution to Problem

According to one embodiment of the present invention, there is provided a power conversion device including: an isolation transformer including a first winding and a second winding; switching elements to be connected to the first winding of the isolation transformer; a first conductor configured to connect one end of the first winding of the isolation transformer to an electrode of the switching elements; and a second conductor configured to connect another end of the first winding of the isolation transformer to another electrode of the switching elements, the first conductor and the second conductor being arranged so as to be parallel to each other along a longitudinal direction of each of the first conductor and the second conductor so that the first conductor and the second conductor are prevented from overlapping each other in the longitudinal direction and a transverse direction of each of the first conductor and the second conductor.

Advantageous Effects of Invention

According to the power conversion device of the present invention, the first conductor connecting the one end of the first wiring of the isolation transformer to an electrode of the switching elements and the second conductor connecting the another end of the first winding of the isolation transformer to another electrode of the switching elements are arranged so as not to overlap each other, and hence the parasitic capacitance to be generated between the first conductor and the second conductor can be decreased. Thus, the surge voltage to be generated at the time of the operation of turning off the switching elements can be suppressed while downsizing is achieved and the insulating performance is ensured.

DESCRIPTION OF EMBODIMENTS

Figure 1A:
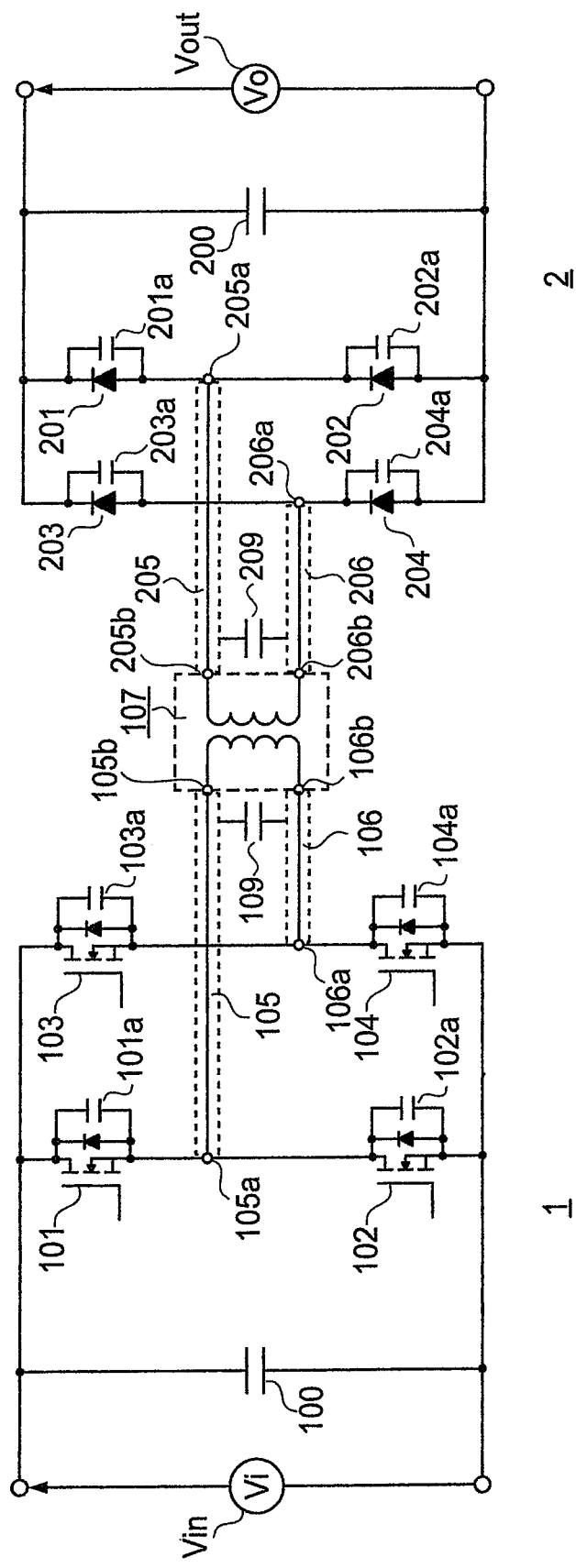
FIG. 1A is a schematic configuration diagram for illustrating a configuration of a power conversion device according to a first embodiment of the present invention.

Referring to the accompanying drawings, power conversion devices according to preferred embodiments of the present invention are now described. Like or corresponding parts in the drawings are denoted by like reference symbols for description, and redundant descriptions are omitted. In each embodiment described below, as the power conversion device, a general full-bridge converter circuit is described as an example.

First Embodiment

Figure 1B:
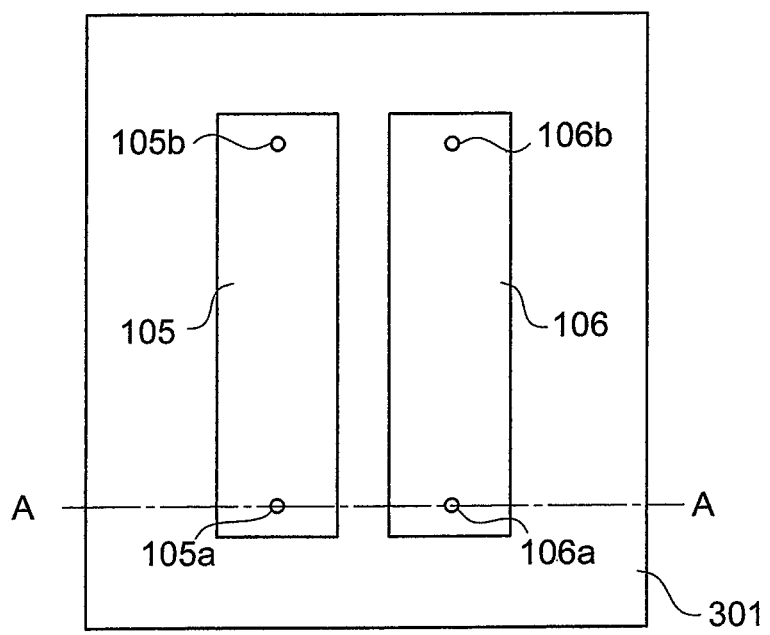
FIG. 1B is a plan view for illustrating the configuration of the power conversion device according to the first embodiment of the present invention.
Figure 1C:
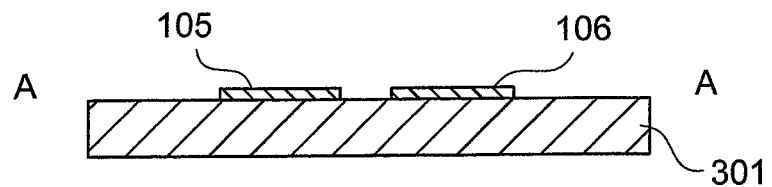
FIG. 1C is an A-A sectional view for illustrating the configuration of the power conversion device according to the first embodiment of the present invention, which is illustrated in FIG. 1B.

FIG. 1A is a configuration diagram for illustrating a circuit configuration of a power conversion device according to a first embodiment of the present invention. Further, FIG. 1B is a plan view for illustrating configurations of a first conductor and a second conductor formed in the power conversion device according to the first embodiment of the present invention, and FIG. 1C is an A-A sectional view of FIG. 1B.

As illustrated in FIG. 1A, the power conversion device includes a primary circuit 1, a secondary circuit 2, and an isolation transformer 107 formed between the primary circuit 1 and the secondary circuit 2.

The primary circuit 1 includes an input capacitor 100, a first switching element 101, a second switching element 102, a third switching element 103, and a fourth switching element 104. The input capacitor 100 is connected in parallel to the subsequent stage of an input voltage Vin. Further, the first switching element 101 has a parasitic capacitance 101a of the first switching element. The second switching element 102 has a parasitic capacitance 102a of the second switching element. The third switching element 103 has a parasitic capacitance 103a of the third switching element. The fourth switching element 104 has a parasitic capacitance 104a of the fourth switching element.

The isolation transformer 107 includes a first winding and a second winding. The first winding is formed on the primary circuit 1 side, and the second winding is formed on the secondary circuit 2 side.

A first conductor 105 is formed between the first winding of the isolation transformer 107 and a node 105a between the first switching element 101 and the second switching element 102. The first conductor 105 connects the above-mentioned node 105a to one end of the first winding of the isolation transformer 107. In the following, the node between the first conductor 105 and the first winding of the isolation transformer 107 is referred to as "node 105b".

A second conductor 106 is formed between the first winding of the isolation transformer 107 and a node 106a between the third switching element 103 and the fourth switching element 104. The second conductor 106 connects the above-mentioned node 106a to another end of the first winding of the isolation transformer 107. In the following, the node between the second conductor 106 and the first winding of the isolation transformer 107 is referred to as "node 106b".

A parasitic capacitance 109 is generated between the first conductor 105 and the second conductor 106.

The secondary circuit 2 includes an output capacitor 200, a fifth switching element 201, a sixth switching element 202, a seventh switching element 203, and an eighth switching element 204. An output voltage Vout is connected in parallel to the subsequent stage of the output capacitor 200. Further, the fifth switching element 201 has a parasitic capacitance 201a of the fifth switching element. The sixth switching element 202 has a parasitic capacitance 202a of the sixth switching element. The seventh switching element 203 has a parasitic capacitance 203a of the seventh switching element. The eighth switching element 204 has a parasitic capacitance 204a of the eighth switching element.

A third conductor 205 is formed between the second winding of the isolation transformer 107 and a node 205a between the fifth switching element 201 and the sixth switching element 202. The third conductor 205 connects the above-mentioned node 205a to one end of the second winding of the isolation transformer 107. In the following, the node between the third conductor 205 and the second winding of the isolation transformer 107 is referred to as "node 205b".

A fourth conductor 206 is formed between the second winding of the isolation transformer 107 and a node 206a between the seventh switching element 203 and the eighth switching element 204. The fourth conductor 206 connects the above-mentioned node 206a to another end of the second winding of the isolation transformer 107. In the following, the node between the fourth conductor 206 and the second winding of the isolation transformer 107 is referred to as "node 206b".

A parasitic capacitance 209 is generated between the third conductor 205 and the fourth conductor 206.

As illustrated in FIG. 1B and FIG. 1C, the first conductor 105 and the second conductor 106 are arranged on an insulating substrate 301. The insulating substrate 301 is made of, for example, glass epoxy.

Now, the configuration is described in more detail.

As described above, at the subsequent stage of the input voltage Vin, the input capacitor 100 is connected in parallel in order to remove a ripple current. At the subsequent stage of the input capacitor 100, a full-bridge circuit including the first to fourth switching elements 101 to 104 is connected in parallel.

The first switching element 101, the second switching element 102, the third switching element 103, and the fourth switching element 104 are each formed of a MOSFET. A positive electrode of the input capacitor 100 is connected to a drain electrode of the first switching element 101 and a drain electrode of the third switching element 103. Further, a drain electrode of the second switching element 102 is connected in series to a source electrode of the first switching element 101, and a drain electrode of the fourth switching element 104 is connected in series to a source electrode of the third switching element 103. Further, a source electrode of the second switching element 102 and a source electrode of the fourth switching element 104 are each connected to a negative electrode of the input capacitor 100.

The first conductor 105 includes the node 105a and the node 105b. As illustrated in FIG. 1B, the node 105a and the node 105b are formed at both ends of the first conductor 105 in a longitudinal direction thereof. Further, as illustrated in FIG. 1B, the node 105a and the node 105b are each formed at a center position of the first conductor 105 in a transverse direction thereof. The "longitudinal direction" refers to a length direction of each of the first conductor 105 and the second conductor 106, and the "transverse direction" refers to a width direction of each of the first conductor 105 and the second conductor 106. In the example, the node 105a and the node 105b are each formed at the center position of the first conductor 105 in the transverse direction thereof, but the positions may be individually set as appropriate. At the node 105a, one end of the first conductor 105 is connected to the source electrode of the first switching element 101 and the drain electrode of the second switching element 102. Further, at the node 105b, another end of the first conductor 105 is connected to the one end of the first winding of the isolation transformer 107.

The second conductor 106 includes the node 106a and the node 106b. As illustrated in FIG. 1B, the node 106a and the node 106b are formed at both ends of the second conductor 106 in a longitudinal direction thereof. Further, as illustrated in FIG. 1B, the node 106a and the node 106b are each formed at a center position of the second conductor 106 in a transverse direction thereof. In the example, the node 106a and the node 106b are each formed at the center position of the second conductor 106 in the transverse direction thereof, but the positions may be individually set as appropriate. At the node 106a, one end of the second conductor 106 is connected to the source electrode of the third switching element 103 and the drain electrode of the fourth switching element 104. Further, at the node 106b, another end of the second conductor 106 is connected to the another end of the first winding of the isolation transformer 107.

Further, as illustrated in FIG. 1C, both of the first conductor 105 and the second conductor 106 are formed on an upper surface of the insulating substrate 301, and hence the first conductor 105 and the second conductor 106 are wired in the same layer. That is, the first conductor 105 and the second conductor 106 are formed in the same plane. In the example of FIG. 1B and FIG. 1C, the first conductor 105 and the second conductor 106 have the same conductor thickness, the same conductor width, and the same conductor length, but the present invention is not limited to this case. The conductor thickness, the conductor width, and the conductor length of each of the first conductor 105 and the second conductor 106 may be individually set as appropriate. Further, as illustrated in FIG. 1B, the first conductor 105 and the second conductor 106 are arranged on the substrate plane of the insulating substrate 301 so that wiring of the first conductor 105 and wiring of the second conductor 106 are prevented from overlapping each other in the conductor transverse direction and the conductor longitudinal direction. Specifically, on the upper surface of the insulating substrate 301, the first conductor 105 and the second conductor 106 are formed apart from each other by a distance set in advance so as to be parallel to each other in the longitudinal direction. This distance is set as appropriate to such a length that insulating performance can be ensured between the first conductor 105 and the second conductor 106.

A full-bridge circuit including the fifth to eighth switching elements 201 to 204 is connected in parallel to the secondary winding of the isolation transformer 107. The fifth switching element 201, the sixth switching element 202, the seventh switching element 203, and the eighth switching element 204 are each formed of a diode. The second winding of the isolation transformer 107 is connected to the fifth to eighth switching elements 201 to 204 via the third conductor 205 and the fourth conductor 206. One end of the third conductor 205 is connected at the node 205b to the second winding of the isolation transformer 107. Another end of the third conductor 205 is connected at the node 205a to an anode electrode of the fifth switching element 201 and a cathode electrode of the sixth switching element 202. Further, one end of the fourth conductor 206 is connected at the node 206b to the second winding of the isolation transformer 107. Another end of the fourth conductor 206 is connected at the node 206a to an anode electrode of the seventh switching element 203 and a cathode electrode of the eighth switching element 204.

A cathode electrode of the fifth switching element 201 and a cathode electrode of the seventh switching element 203 are each connected to a positive electrode of the output capacitor 200. Further, an anode electrode of the sixth switching element 202 and an anode electrode of the eighth switching element 204 are each connected to a negative electrode of the output capacitor 200. Further, the output voltage Vout is connected in parallel at the subsequent stage of the output capacitor 200. A controller (not shown) is configured to control on/off of the first to fourth switching elements 101 to 104 to enable output of the output voltage Vout as appropriate. In the example, diodes are used for the fifth to eighth switching elements 201 to 204, but MOSFETs or other switching elements may be used for on/off control.

Figure 2:
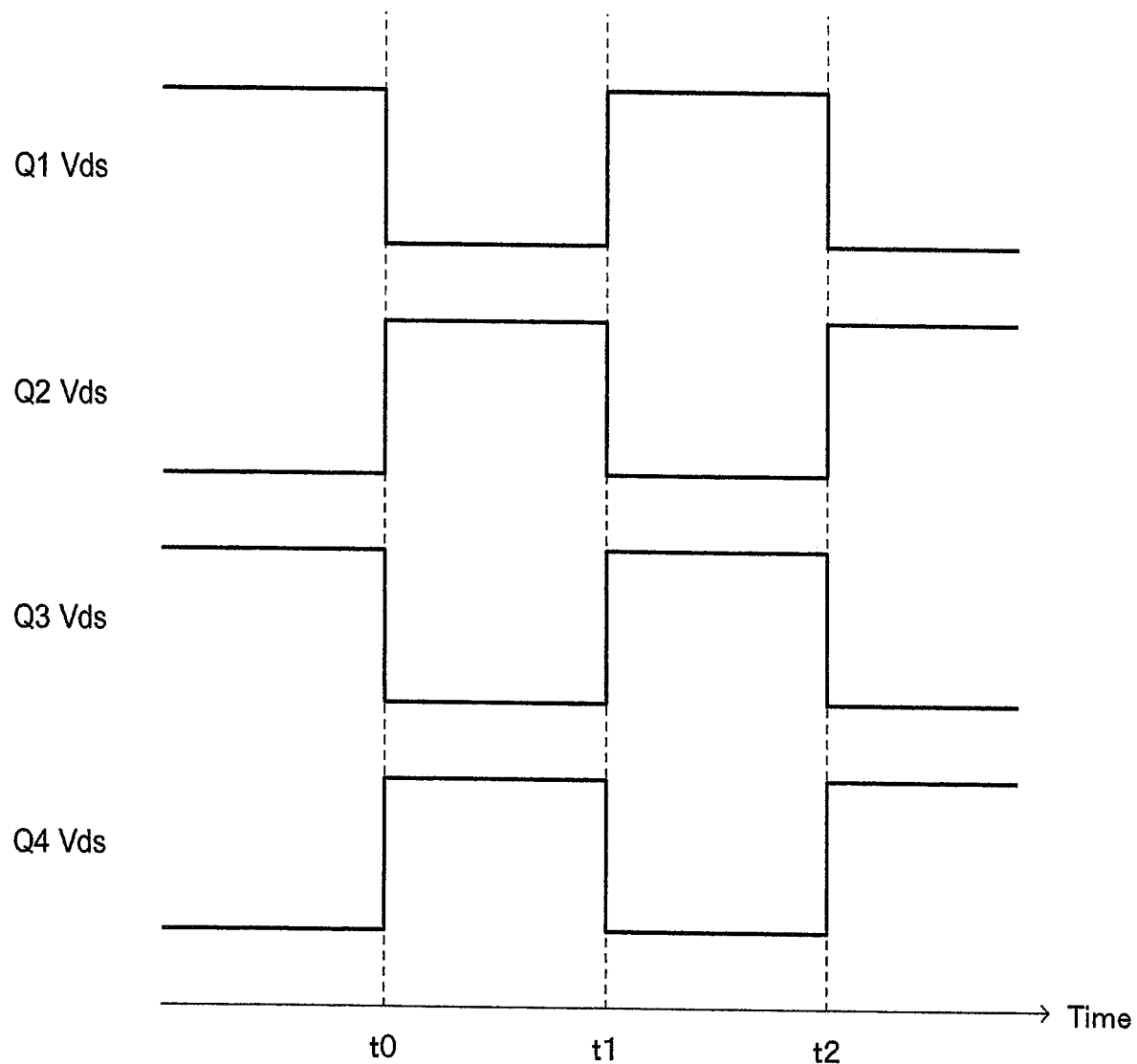
FIG. 2 is a voltage waveform graph for showing an operation of the power conversion device according to the first embodiment of the present invention.

FIG. 2 is an explanatory graph for showing operations of the first to fourth switching elements 101 to 104. The horizontal axis represents time ("Time"), and Q1 to Q4 of the vertical axis represent the on/off states of the first to fourth switching elements 101 to 104, respectively. As shown in FIG. 2, until Time reaches t0, the first switching element 101 and the third switching element 103 are in a switch-off state, and the second switching element 102 and the fourth switching element 104 are in a switch-on state. Next, at the timing at which Time reaches t0, the first switching element 101 and the third switching element 103 are turned on, and the second switching element 102 and the fourth switching element 104 are turned off. Further, at the timing at which Time reaches t1, the first switching element 101 and the third switching element 103 are turned off, and the second switching element 102 and the fourth switching element 104 are turned on. As described above, at the timing at which Time reaches t0, t1, t2, . . . , each of the switching elements 101 to 104 repeats the on/off operation.

Figure 3:
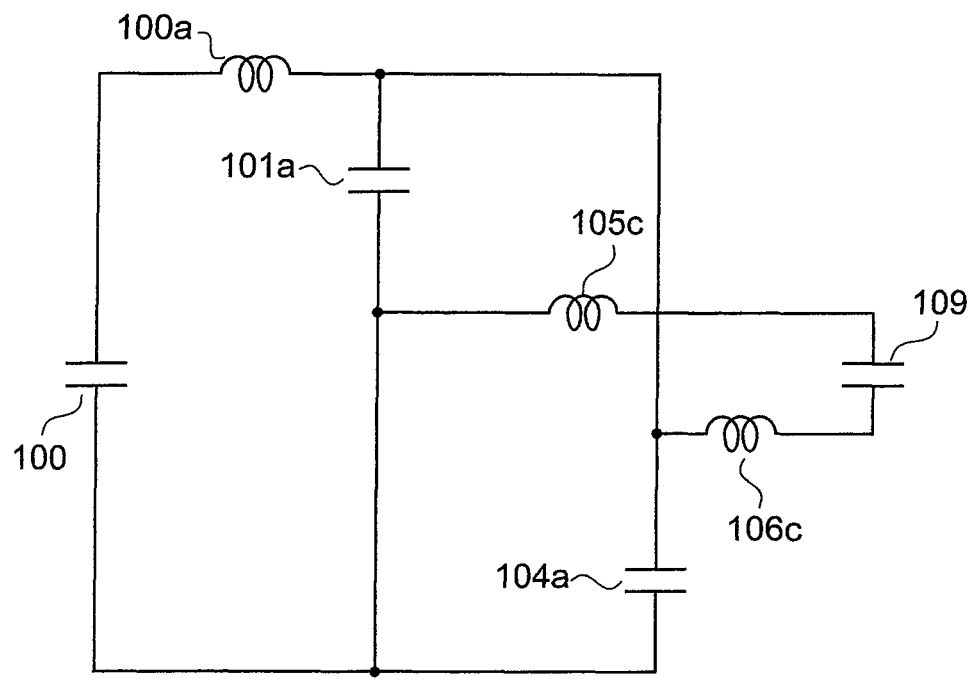
FIG. 3 is a diagram for illustrating an equivalent circuit at the time of surge voltage generation at a predetermined timing in the first embodiment of the present invention.
Figure 4A:
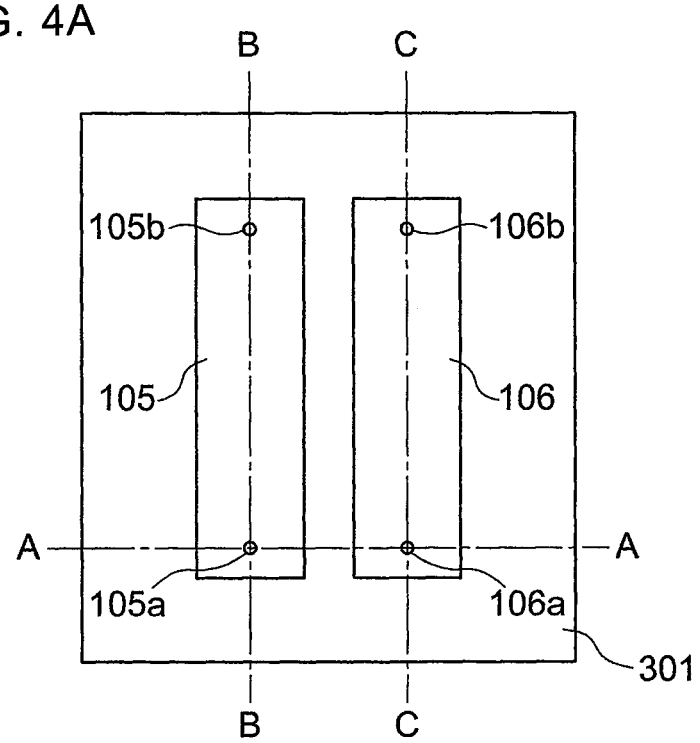
FIG. 4A is a plan view for illustrating a configuration of a power conversion device according to a second embodiment of the present invention.
Figure 4B:
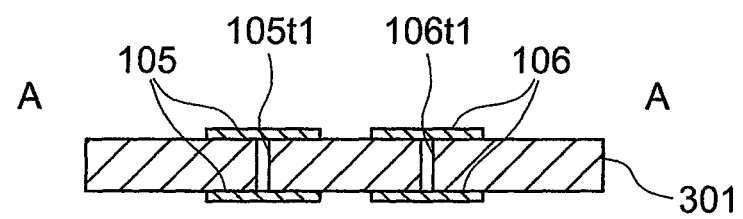
FIG. 4B is an A-A sectional view for illustrating the configuration of the power conversion device according to the second embodiment of the present invention, which is illustrated in FIG. 4A.
Figure 4C:
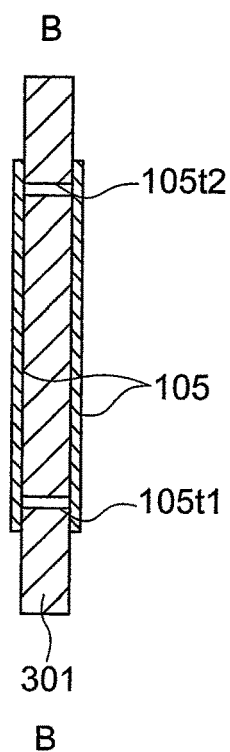
FIG. 4C is a B-B sectional view for illustrating the configuration of the power conversion device according to the second embodiment of the present invention, which is illustrated in FIG. 4A.
Figure 4D:
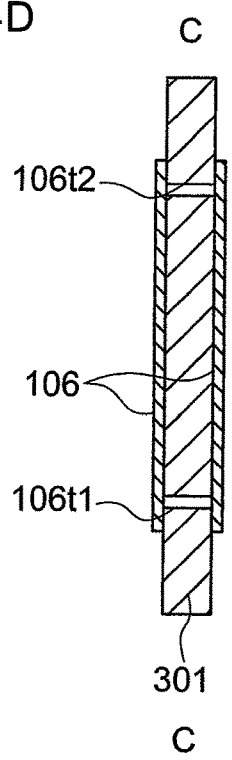
FIG. 4D is a C-C sectional view for illustrating the configuration of the power conversion device according to the second embodiment of the present invention, which is illustrated in FIG. 4A.

FIG. 3 is an equivalent circuit diagram for illustrating an example at the timing of t1, at which a surge voltage is generated. Symbol 100a represents a combined inductance of the following three inductance components (1) to (3): (1) an inductance component from the positive electrode of the input capacitor 100 to each of the drain terminals of the first switching element 101 and the third switching element 103; (2) an inductance component from each of the source terminals of the first switching element 101 and the third switching element 103 to each of the drain terminals of the second switching element 102 and the fourth switching element 104; and (3) an inductance component from each of the source terminals of the second switching element 102 and the fourth switching element 104 to the negative electrode of the input capacitor 100. The combined inductance 100a further includes an inductance component of the turned-on switching element itself.

Symbol 105c represents an inductance component of the first conductor 105 connecting the isolation transformer 107 to each of the first switching element 101 and the second switching element 102. Symbol 106c represents an inductance component of the second conductor 106 connecting the isolation transformer 107 to each of the third switching element 103 and the fourth switching element 104. Further, symbol 101a represents a drain-source parasitic capacitance component (Coss) of the first switching element 101. Symbol 104a represents a drain-source parasitic capacitance component (Coss) of the fourth switching element 104. Symbol 109 represents a parasitic capacitance component to be generated between conductors, that is, between the first conductor 105 and the second conductor 106. Coss 101a of the first switching element 101 and Coss 104a of the fourth switching element appear to be connected in parallel to the parasitic capacitance 109 between the conductors, that is, between the first conductor 105 and the second conductor 106.

At the timing of t1, when the first switching element 101 and the third switching element 103 are turned off, a surge voltage V of V=L×di/dt is generated because of a combined inductance L of the inductance components 100a, 105c, and 106c. In the first embodiment, the first conductor 105 and the second conductor 106 are prevented from overlapping each other, and hence the parasitic capacitance 109 between the conductors, which is to be generated between the first conductor 105 and the second conductor 106, is decreased. When the parasitic capacitance 109 is decreased, the impedance of the parasitic capacitance 109 is increased because of the relationship of $Z=1/(j\omega C)$, and a current flowing through the parasitic capacitance 109 is decreased. Therefore, a current is less liable to flow through the inductances 105c and 106c of the first conductor 105 and the second conductor 106, which are connected in series to the parasitic capacitance 109. Thus, increase of the surge voltage V due to the inductances 105c and 106c can be suppressed. A similar effect can be obtained also at the timing of to, at which the second switching element 102 and the fourth switching element 104 are turned off.

Figure 16A:
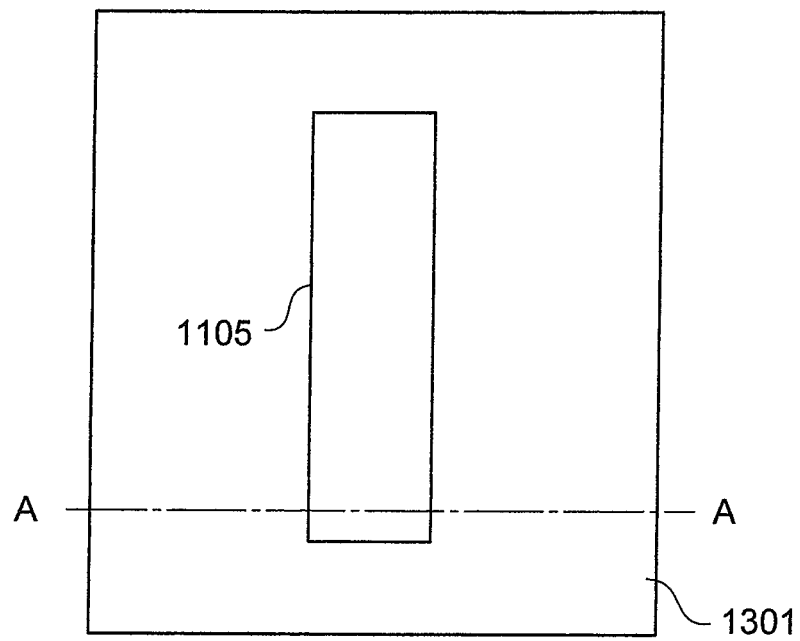
FIG. 16A is a plan view for illustrating a configuration of a related-art power conversion device.
Figure 16B:
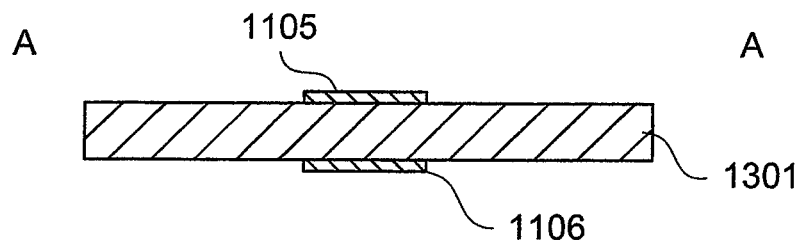
FIG. 16B is an A-A sectional view for illustrating the configuration of the related-art power conversion device, which is illustrated in FIG. 16A.

In order to compare the power conversion device according to the first embodiment with the related-art power conversion device described in Patent Literature 1, the configuration of the related-art power conversion device is illustrated in FIG. 16A and FIG. 16B. FIG. 16A is a plan view, and FIG. 16B is an A-A sectional view. The related-art power conversion device employs the following configuration. As illustrated in FIG. 16A and FIG. 16B, a first conductor 1105 and a second conductor 1106 overlap each other in a longitudinal direction and a transverse direction thereof so that magnetic fluxes generated from currents of the conductors are canceled out. In this manner, the inductance is reduced, and the surge voltage is suppressed. That is, in the related-art power conversion device, as illustrated in FIG. 16A and FIG. 16B, the first conductor 1105 and the second conductor 1106 are arranged completely at the same position across a substrate 1301. Therefore, the first conductor 1105 and the second conductor 1106 are prevented from overlapping each other in the conductor thickness direction, but the first conductor 1105 and the second conductor 1106 completely overlap each other in the conductor transverse direction and the conductor longitudinal direction. As viewed from above as in FIG. 16A, the position of the first conductor 1105 and the position of the second conductor 1106 completely overlap each other.

However, the related-art power conversion device has such a configuration, and hence a parasitic capacitance 1109 to be generated between the first conductor 1105 and the second conductor 1106 is increased, and the current flowing through the parasitic capacitance is increased. As a result, a surge voltage is generated due to the influence of the inductance of the first conductor 1105 and the inductance of the second conductor 1106.

In contrast, in the first embodiment of the present invention, a current flowing through the parasitic capacitance 109 to be generated between the first conductor 105 and the second conductor 106 is decreased. Therefore, the influence of the inductance 105c of the first conductor 105 and the inductance 106c of the second conductor 106, which are connected in series to the parasitic capacitance 109, can be decreased, and the increase of the surge voltage can be suppressed.

Figure 17:
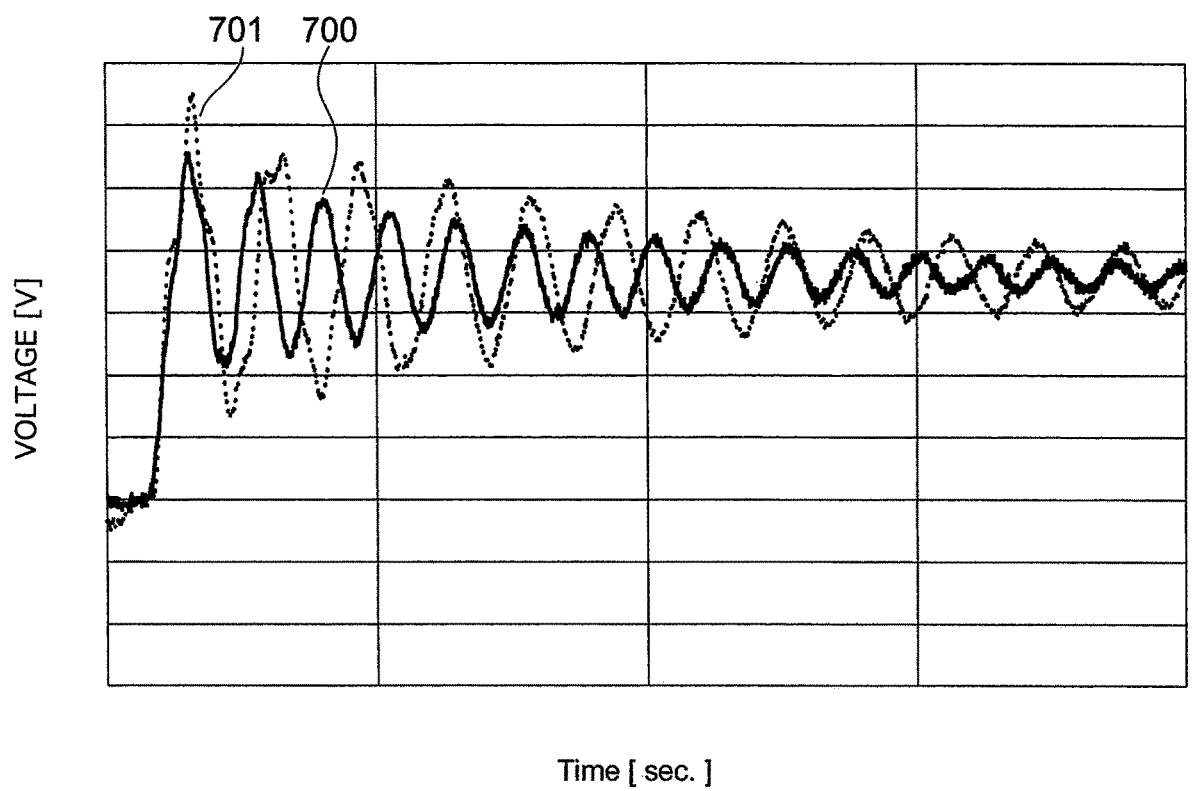
FIG. 17 is a waveform chart for showing surge voltages of the related-art power conversion device and the power conversion device according to the first embodiment of the present invention.

FIG. 17 is a graph for showing an example of waveforms of surge voltages of the related-art power conversion device and the power conversion device according to the first embodiment. In FIG. 17, the horizontal axis represents time, and the vertical axis represents surge voltage. Further, in FIG. 17, a waveform 700 indicated by the solid line represents a waveform of the surge voltage in the first embodiment of the present invention, and a waveform 701 indicated by the dotted line represents a waveform of the surge voltage in the related-art power conversion device. As shown in FIG. 17, the power conversion device according to the first embodiment has a smaller surge voltage at the time of turn-off as compared to that of the related-art power conversion device.

As described above, according to the first embodiment of the present invention, the power conversion device includes the isolation transformer 107 including the first winding and the second winding, the switching elements 101 to 104 connected to the first winding of the isolation transformer 107, and the two conductors 105 and 106 connecting both ends of the first winding of the isolation transformer 107 to the switching elements 101 to 104. In the power conversion device, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. With this configuration, the parasitic capacitance 109 between the two conductors 105 and 106 is decreased. In this manner, at the time of an operation of turning off the switching elements, the surge voltage generated due to the inductance components of the two conductors 105 and 106 can be suppressed. That is, the two conductors 105 and 106 are arranged so as not to overlap each other, and hence a current flowing through the parasitic capacitance 109 to be generated between the first conductor 105 and the second conductor 106 is decreased. Thus, the influence of the inductance 105c of the first conductor 105 and the inductance 106c of the second conductor 106, which are connected in series to the parasitic capacitance 109, can be decreased, and the increase of the surge voltage can be suppressed. Therefore, wide conductor plates are not required to be used unlike the related-art power conversion device. As a result, a mounting area can be reduced and downsizing can be achieved while an appropriate distance for ensuring the insulating performance is secured between the two conductors 105 and 106.

The scope of application of the present invention is not limited to the structure illustrated in FIG. 1A, FIG. 1B, and FIG. 1C as the first embodiment. Various modifications can be made thereto as illustrated in FIG. 4A to FIG. 17 to be referred to later, in which modification examples of the structure are illustrated as different embodiments.

Further, in FIG. 1A, four switching elements 101 to 104 are formed in the primary circuit 1, and four switching elements 201 to 204 are formed in the secondary circuit 2, but the number of the switching elements is not limited to 4, and may be changed as appropriate.

Second Embodiment

The overall configuration of a power conversion device according to a second embodiment of the present invention is the same as the above-mentioned configuration of the first embodiment illustrated in FIG. 1A.

FIG. 4A to FIG. 4D are schematic configuration views for illustrating configurations of the first conductor 105 and the second conductor 106 formed in the power conversion device according to the second embodiment of the present invention. In the above-mentioned first embodiment, as illustrated in FIG. 1B and FIG. 1C, the first conductor 105 and the second conductor 106 are wired on one surface of the insulating substrate 301. In the second embodiment, as illustrated in FIG. 4A to FIG. 4D, the first conductor 105 and the second conductor 106 are wired on both surfaces of the insulating substrate 301.

Further, the first conductors 105 wired on both the surfaces of the insulating substrate 301 are electrically connected to each other via through holes 105t1 and 105t2. The through holes 105t1 and 105t2 are formed so as to pass through the insulating substrate 301 from the upper surface to a lower surface of the insulating substrate 301 in a thickness direction of the insulating substrate 301. Further, the through holes 105t1 and 105t2 are formed at both ends of the first conductor 105 in the longitudinal direction thereof. In the example of FIG. 4A to FIG. 4D, the through holes 105t1 and 105t2 are arranged at positions of the nodes 105a and 105b formed at both ends of the first conductor 105, respectively. Therefore, the through hole 105t1 connects the first conductors 105 formed on both the surfaces of the insulating substrate 301 to each other at the node 105a. The through hole 105t2 connects the first conductors 105 formed on both the surfaces of the insulating substrate 301 to each other at the node 105b.

Further, the second conductors 106 wired on both the surfaces of the insulating substrate 301 are electrically connected to each other via through holes 106t1 and 106t2. The through holes 106t1 and 106t2 are formed so as to pass through the insulating substrate 301 from the upper surface to the lower surface of the insulating substrate 301 in the thickness direction of the insulating substrate 301. Further, the through holes 106t1 and 106t2 are formed at both ends of the second conductor 106 in the longitudinal direction thereof. In the example of FIG. 4A to FIG. 4D, the through holes 106t1 and 106t2 are arranged at positions of the nodes 106a and 106b formed at both ends of the second conductor 106, respectively. Therefore, the through hole 106t1 connects the second conductors 106 formed on both the surfaces of the insulating substrate 301 to each other at the node 106a. The through hole 106t2 connects the second conductors 106 formed on both the surfaces of the insulating substrate 301 to each other at the node 106b.

Those points differ from the first embodiment.

That is, in the first embodiment, the first conductor 105 and the second conductor 106 are formed in the same layer, and are formed of a single layer. In contrast, in the second embodiment, the first conductor 105 and the second conductor 106 are formed on both the surfaces of the insulating substrate 301, and are each formed of two layers.

In the second embodiment, two first conductors 105 are laminated in the vertical direction with the insulating substrate 301 interposed therebetween, and those first conductors 105 are electrically connected to each other via the through holes. Similarly, two second conductors 106 are laminated in the vertical direction with the insulating substrate 301 interposed therebetween, and those second conductors 106 are electrically connected to each other via the through holes.

As described above, in the second embodiment, the two first conductors 105 are electrically connected to each other via the through holes 105t1 and 105t2. Therefore, the combined inductance of the two first conductors 105 is smaller as compared to the case in which the first conductor 105 is formed of a single layer.

Further, similarly, the two second conductors 106 are electrically connected to each other via the through holes 106t1 and 106t2. Therefore, the combined inductance of the two second conductors 106 is smaller as compared to the inductance when the second conductor 106 is formed of a single layer.

Further, on the upper surface of the insulating substrate 301, the first conductor 105 and the second conductor 106 are arranged so as to be parallel to each other and prevented from overlapping each other. Therefore, the parasitic capacitance 109 to be generated between the first conductor 105 and the second conductor 106 can be decreased. As a result, an impedance Z of the parasitic capacitance 109 is increased, and a current is less liable to flow through the inductance 105c of the first conductor 105 and the inductance 106c of the second conductor 106, which are connected in series to the parasitic capacitance 109.

As described above, in the second embodiment, the parasitic capacitance 109 between the first conductor 105 and the second conductor 106 can be decreased while the inductance 105c of the first conductor 105 and the inductance 106c of the second conductor 106 are reduced.

In the second embodiment, the node 105a and the through hole 105t1, the node 105b and the through hole 105t2, the node 106a and the through hole 106t1, and the node 106b and the through hole 106t2 are each located at the same position, but the positions of the through holes 105t1, 105t2, 106t1, and 106t2 may differ from those of the nodes 105a, 105b, 106a, and 106b, respectively. Further, in the second embodiment, one-point connection is established at each node, but multi-point connection may be employed.

As described above, also in the second embodiment, similarly to the first embodiment, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed.

Further, in the second embodiment, the first conductor 105 includes two laminated conductors, and the second conductor 106 includes two laminated conductors. The two conductors forming the first conductor 105 are connected in parallel to each other via the through holes, and the two conductors forming the second conductor 106 are connected in parallel to each other via the through holes. With this configuration, the combined inductance of the two conductors forming the first conductor 105 and the combined inductance of the two conductors forming the second conductor 106 can be decreased. Thus, the increase of the surge voltage can be further suppressed.

Third Embodiment

The overall configuration of a power conversion device according to a third embodiment of the present invention is the same as the above-mentioned configuration of the first embodiment illustrated in FIG. 1A.

Figure 5A:
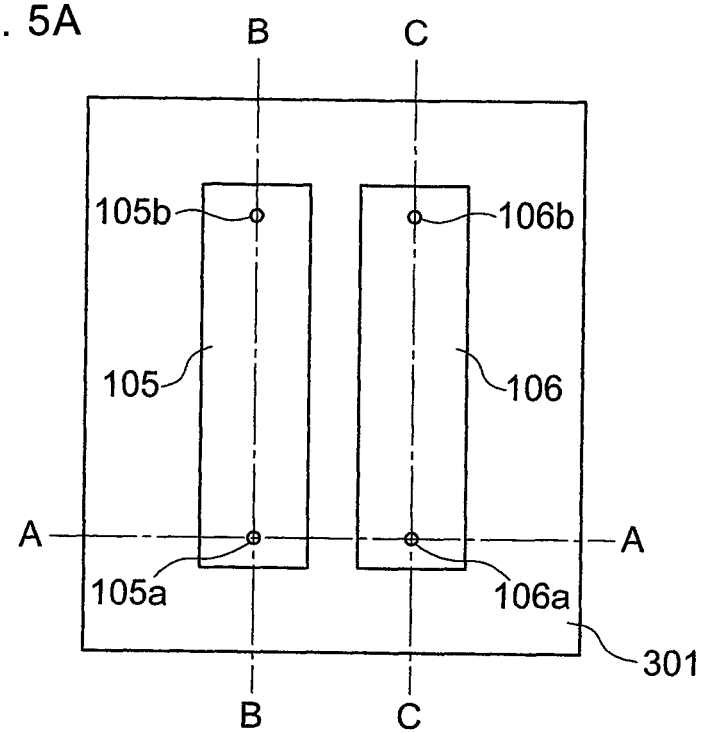
FIG. 5A is a plan view for illustrating a configuration of a power conversion device according to a third embodiment of the present invention.
Figure 5B:
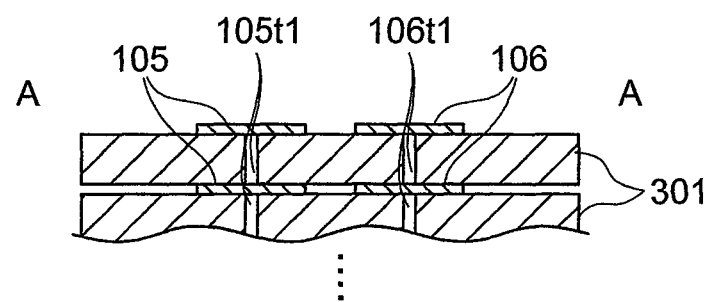
FIG. 5B is an A-A sectional view for illustrating the configuration of the power conversion device according to the third embodiment of the present invention, which is illustrated in FIG. 5A.
Figure 5C:
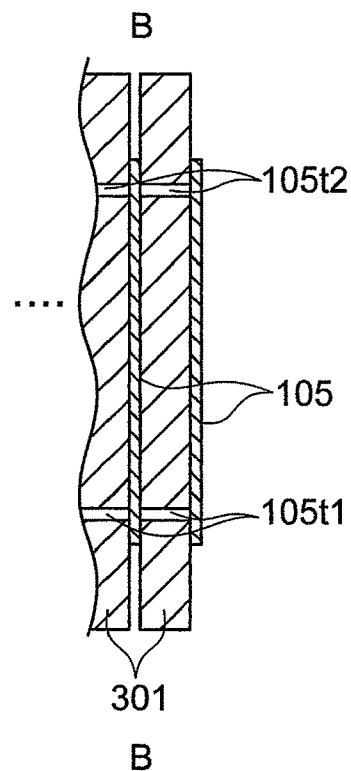
FIG. 5C is a B-B sectional view for illustrating the configuration of the power conversion device according to the third embodiment of the present invention, which is illustrated in FIG. 5A.
Figure 5D:
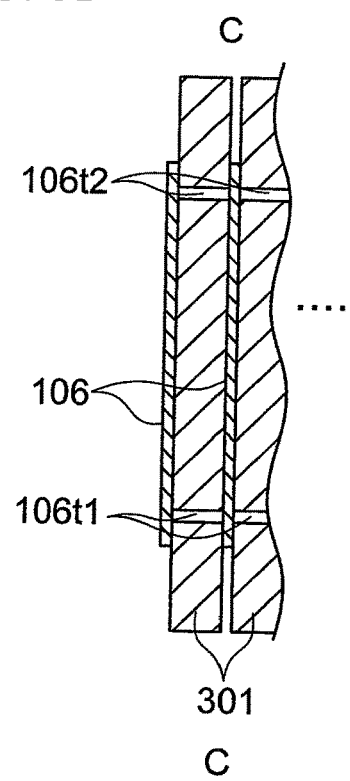
FIG. 5D is a C-C sectional view for illustrating the configuration of the power conversion device according to the third embodiment of the present invention, which is illustrated in FIG. 5A.

FIG. 5A to FIG. 5D are schematic configuration views for illustrating configurations of the first conductor 105 and the second conductor 106 formed in the power conversion device according to the third embodiment of the present invention. In the above-mentioned second embodiment, the insulating substrate 301 is formed of a single layer, and the first conductor 105 and the second conductor 106 are each wired in two layers. In contrast, in the third embodiment, the insulating substrate 301 is formed of two or more layers, and the first conductor 105 and the second conductor 106 are also each wired in two or more layers. That is, in the third embodiment, as illustrated in FIG. 5A to FIG. 5D, a plurality of insulating substrates 301 are laminated. Further, on the upper surface of each of the insulating substrates 301, the first conductor 105 and the second conductor 106 are formed. The insulating substrate 301 formed on the lowermost electrode may have the first conductor 105 and the second conductor 106 formed not only on the upper surface but also on the lower surface thereof. The first conductor 105 and the second conductor 106 are each installed at the same position on the substrate plane of each of the insulating substrates 301. Therefore, as illustrated in FIG. 5B, as viewed from the lateral side, the first conductors 105 of the insulating substrates 301 are arranged side by side in the vertical direction. Similarly, the second conductors 106 of the insulating substrates 301 are arranged side by side in the vertical direction. Further, the first conductors 105 wired on the insulating substrates 301 are electrically connected to each other via the through holes 105t1 and 105t2. Further, the second conductors 106 wired on the insulating substrates 301 are electrically connected to each other via the through holes 106t1 and 106t2. Those points differ from the second embodiment. As described above, in the third embodiment, the plurality of first conductors 105 are connected in parallel to each other, and the plurality of second conductors 106 are also connected in parallel to each other. Therefore, the parasitic capacitance 109 between the first conductor 105 and the second conductor 106 can be decreased while the inductance 105c of the first conductor 105 and the inductance 106c of the second conductor 106 are reduced.

In the third embodiment, the node 105a and the through hole 105t1, the node 105b and the through hole 105t2, the node 106a and the through hole 106t1, and the node 106b and the through hole 106t2 are each connected at the same position, but the positions of the through holes 105t1, 105t2, 106t1, and 106t2 may differ from those of the nodes 105a, 105b, 106a, and 106b, respectively. Further in the third embodiment, one-point connection is established at each node, but multi-point connection may be employed.

In the third embodiment as well, similarly to the first and second embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed.

Further, in the third embodiment, the first conductor 105 includes the plurality of laminated conductors, and the second conductor 106 includes the plurality of laminated conductors. The plurality of laminated conductors forming the first conductor 105 are connected in parallel to each other via the through holes, and the plurality of laminated conductors forming the second conductor 106 are connected in parallel to each other via the through holes. With this configuration, the combined inductance of the plurality of laminated conductors forming the first conductor 105 and the combined inductance of the plurality of laminated conductors forming the second conductor 106 can be decreased. Thus, the increase of the surge voltage can be further suppressed.

Fourth Embodiment

The overall configuration of a power conversion device according to a fourth embodiment of the present invention is the same as the above-mentioned configuration of the first embodiment illustrated in FIG. 1A.

Figure 6A:
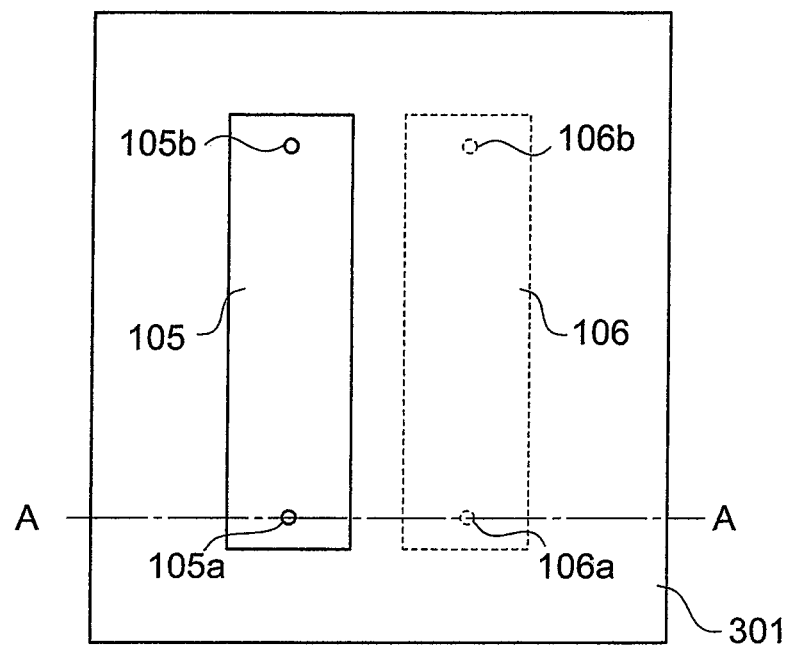
FIG. 6A is a plan view for illustrating a configuration of a power conversion device according to a fourth embodiment of the present invention.
Figure 6B:
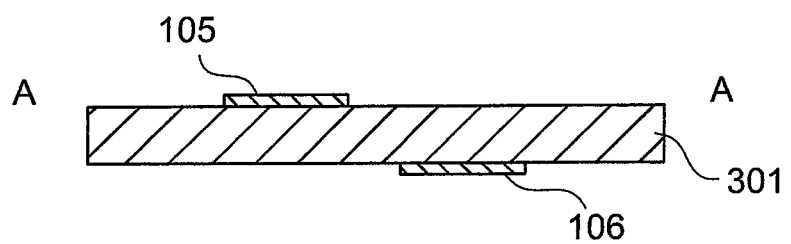
FIG. 6B is an A-A sectional view for illustrating the configuration of the power conversion device according to the fourth embodiment of the present invention, which is illustrated in FIG. 6A.

FIG. 6A and FIG. 6B are schematic configuration views for illustrating configurations of the first conductor 105 and the second conductor 106 formed in the power conversion device according to the fourth embodiment of the present invention. In the above-mentioned first embodiment, the first conductor 105 and the second conductor 106 are wired on the same surface of the insulating substrate 301. The fourth embodiment differs from the first embodiment in that, as illustrated in FIG. 6A and FIG. 6B, the first conductor 105 and the second conductor 106 are wired on different surfaces of the insulating substrate 301. Specifically, in the fourth embodiment, as illustrated in FIG. 6A and FIG. 6B, the first conductor 105 in the above-mentioned first embodiment illustrated in FIG. 1B and FIG. 1C is formed on the upper surface of the insulating substrate 301, and the second conductor 106 is formed on the lower surface of the insulating substrate 301. In the fourth embodiment, the first conductor 105 and the second conductor 106 are formed in different planes that are parallel to each other.

As a result, in the fourth embodiment, as illustrated in FIG. 6A, the wiring of the first conductor 105 and the wiring of the second conductor 106 are prevented from overlapping each other in the longitudinal direction and the transverse direction. Further, as illustrated in FIG. 6B, the wiring of the first conductor 105 and the wiring of the second conductor 106 are prevented from overlapping each other also in the conductor thickness direction. Therefore, the parasitic capacitance 109 between the first conductor 105 and the second conductor 106 is further decreased.

As described above, also in the fourth embodiment, similarly to the first to third embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed. Further, in the fourth embodiment, the first conductor 105 and the second conductor 106 are formed indifferent planes that are parallel to each other, and hence the wiring of the first conductor 105 and the wiring of the second conductor 106 are prevented from overlapping each other also in the conductor thickness direction. Therefore, the parasitic capacitance 109 between the first conductor 105 and the second conductor 106 can be further decreased.

Fifth Embodiment

The overall configuration of a power conversion device according to a fifth embodiment of the present invention is the same as the above-mentioned configuration of the first embodiment illustrated in FIG. 1A.

FIG. 7A to FIG. 7D are schematic configuration views for illustrating configurations of the first conductor 105 and the second conductor 106 formed in the power conversion device according to the fifth embodiment of the present invention. In the above-mentioned fourth embodiment illustrated in FIG. 6A and FIG. 6B, the insulating substrate 301 is formed of a single layer. In contrast, in the fifth embodiment, as illustrated in FIG. 7A to FIG. 7D, the insulating substrate 301 is formed of a plurality of layers, and the first conductors 105 wired on the insulating substrates 301 are connected to each other via the through holes 105t1 and 105t2. Further, the second conductors 106 wired on the insulating substrates 301 are connected to each other via the through holes 106t1 and 106t2. Those points differ from the fourth embodiment.

In the fifth embodiment, the plurality of first conductors 105 are connected in parallel to each other, and the plurality of second conductors 106 are also connected in parallel to each other. Therefore, the parasitic capacitance 109 between the first conductor 105 and the second conductor 106 can be decreased while the inductance 105c of the first conductor and the inductance 106c of the second conductor are reduced.

Figure 7A:
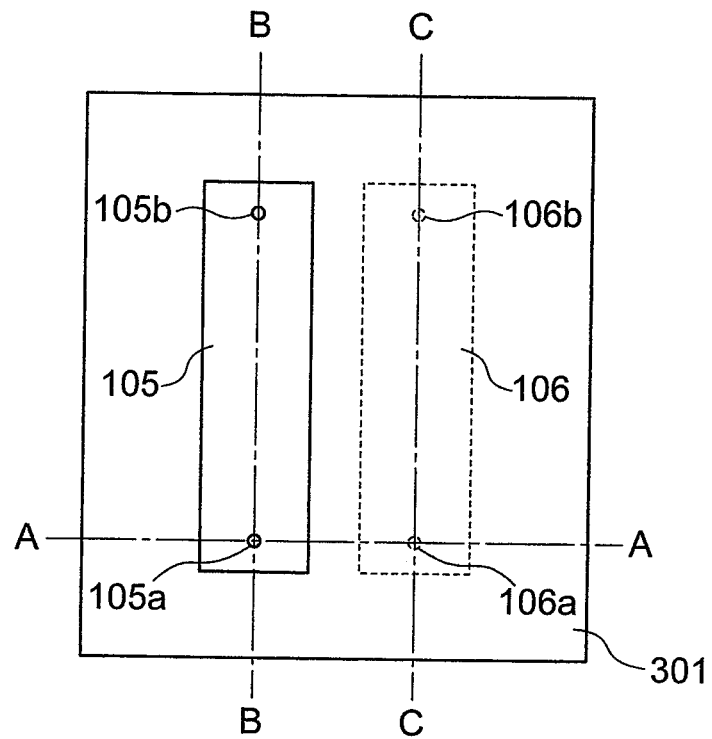
FIG. 7A is a plan view for illustrating a configuration of a power conversion device according to a fifth embodiment of the present invention.
Figure 7B:
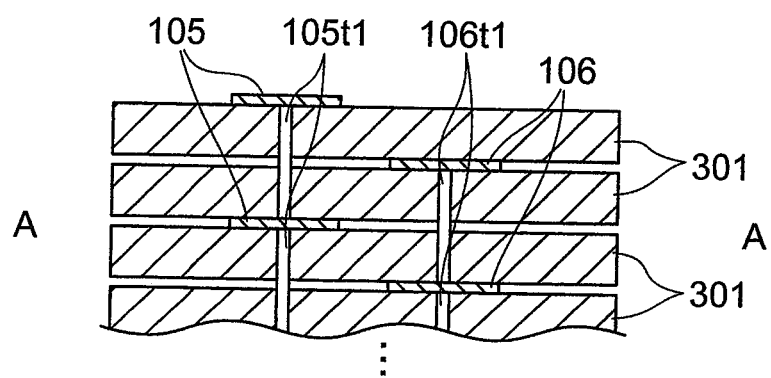
FIG. 7B is an A-A sectional view for illustrating the configuration of the power conversion device according to the fifth embodiment of the present invention, which is illustrated in FIG. 7A.
Figure 7C:
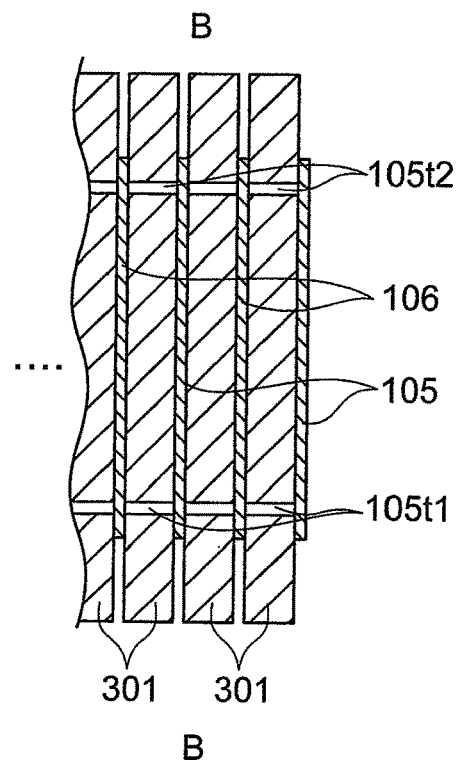
FIG. 7C is a B-B sectional view for illustrating the configuration of the power conversion device according to the fifth embodiment of the present invention, which is illustrated in FIG. 7A.
Figure 7D:
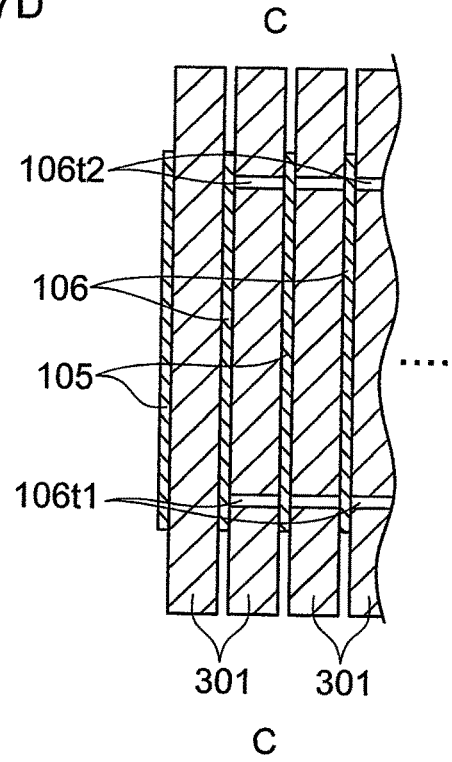
FIG. 7D is a C-C sectional view for illustrating the configuration of the power conversion device according to the fifth embodiment of the present invention, which is illustrated in FIG. 7A.

Further, in the fifth embodiment, similarly to the fourth embodiment, as illustrated in FIG. 7A, the wiring of the first conductor 105 and the wiring of the second conductor 106 are prevented from overlapping each other in the substrate plane. Further, as illustrated in FIG. 7B, the wiring of the first conductor 105 and the wiring of the second conductor 106 are prevented from overlapping each other in the thickness direction. Therefore, the parasitic capacitance 109 between the first conductor 105 and the second conductor 106 is decreased.

In the fifth embodiment, the node 105a and the through hole 105t1, the node 105b and the through hole 105t2, the node 106a and the through hole 106t1, and the node 106b and the through hole 106t2 are each connected at the same position, but the positions of the through holes 105t1, 105t2, 106t1, and 106t2 may differ from those of the nodes 105a, 105b, 106a, and 106b, respectively. Further in the fifth embodiment, one-point connection is established at each node, but multi-point connection may be employed.

As described above, also in the fifth embodiment, similarly to the first to fourth embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed.

Further, in the fifth embodiment, the first conductor 105 includes the plurality of laminated conductors, and the second conductor 106 includes the plurality of laminated conductors. The plurality of laminated conductors forming the first conductor 105 are connected in parallel to each other via the through holes, and the plurality of laminated conductors forming the second conductor 106 are connected in parallel to each other via the through holes. With this configuration, the combined inductance of the plurality of laminated conductors forming the first conductor 105 and the combined inductance of the plurality of laminated conductors forming the second conductor 106 can be decreased. Thus, the increase of the surge voltage can be further suppressed.

Sixth Embodiment

The overall configuration of a power conversion device according to a sixth embodiment of the present invention is the same as the above-mentioned configuration of the first embodiment illustrated in FIG. 1A.

Figure 8A:
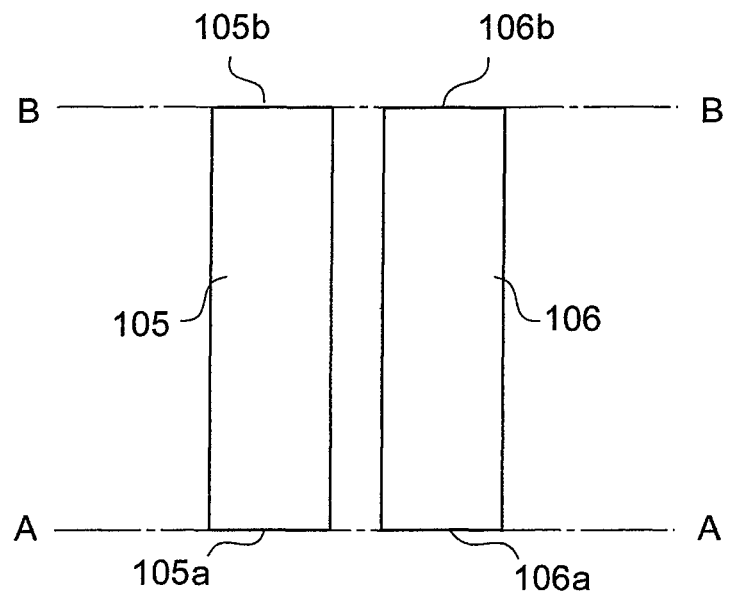
FIG. 8A is a plan view for illustrating a configuration of a power conversion device according to a sixth embodiment of the present invention.
Figure 8B:
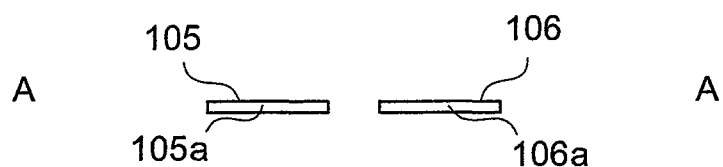
FIG. 8B is an A-A side view for illustrating the configuration of the power conversion device according to the sixth embodiment of the present invention, which is illustrated in FIG. 8A.
Figure 8C:
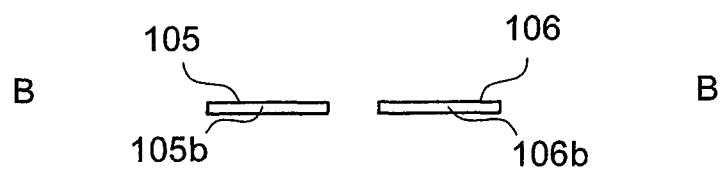
FIG. 8C is a B-B side view for illustrating the configuration of the power conversion device according to the sixth embodiment of the present invention, which is illustrated in FIG. 8A.
Figure 12A:
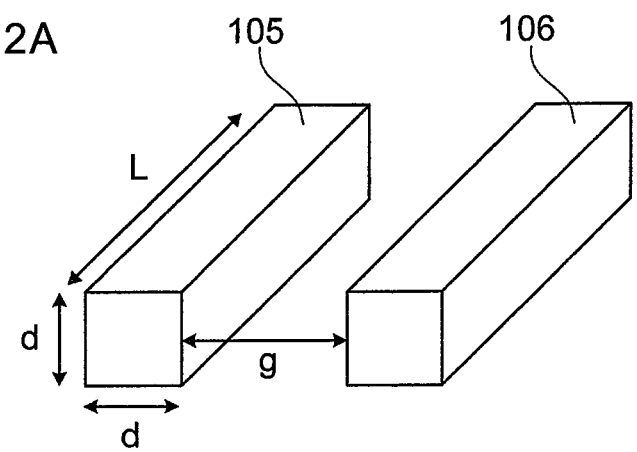
FIG. 12A is a perspective view for illustrating an example of shapes of a first conductor and a second conductor in a power conversion device according to a tenth embodiment of the present invention.

FIG. 8A to FIG. 8C are schematic configuration views for illustrating configurations of the first conductor 105 and the second conductor 106 formed in the power conversion device according to the sixth embodiment of the present invention. In the above-mentioned first embodiment, the first conductor 105 and the second conductor 106 are wired on the insulating substrate 301. The sixth embodiment differs from the first embodiment in that the first conductor 105 and the second conductor 106 are each formed of a metal bus bar. In this case, the metal bus bar is, as illustrated in FIG. 8A to FIG. 8C, a plate-like conductor made of copper, aluminum, or other metals. Alternatively, the first conductor 105 and the second conductor 106 may each be formed of a metal bus bar formed of such a prism-shaped conductor as illustrated in FIG. 12A.

In the sixth embodiment, as illustrated in FIG. 8B and FIG. 8C, the first conductor 105 and the second conductor 106 are arranged in the same plane in a space. Further, as illustrated in FIG. 8A, the first conductor 105 and the second conductor 106 are provided apart from each other by a distance set in advance so as to be parallel to each other so that the wiring of the first conductor 105 and the wiring of the second conductor 106 are prevented from overlapping each other.

As described above, in the sixth embodiment, the first conductor 105 and the second conductor 106 are each formed of a metal bus bar, and thus the insulating substrate 301 is not used. With this configuration, as compared to the above-mentioned first embodiment, the influence of the specific dielectric constant of the insulating substrate 301 is reduced. Therefore, for example, when the first conductor 105 and the second conductor 106 in the sixth embodiment are formed to have the same conductor thickness, the same conductor width, and the same conductor length as those of the first conductor 105 and the second conductor 106 in the first embodiment, and the first conductor 105 and the second conductor 106 each formed of the metal bus bar in the sixth embodiment are arranged in air, the parasitic capacitance 109 between the first conductor 105 and the second conductor 106 can be further decreased.

As described above, also in the sixth embodiment, similarly to the first to fifth embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed. Further, in the sixth embodiment, the insulating substrate 301 is not provided, and hence the parasitic capacitance 109 can be further decreased.

Seventh Embodiment

The overall configuration of a power conversion device according to a seventh embodiment of the present invention is the same as the above-mentioned configuration of the first embodiment illustrated in FIG. 1A.

Figure 9A:
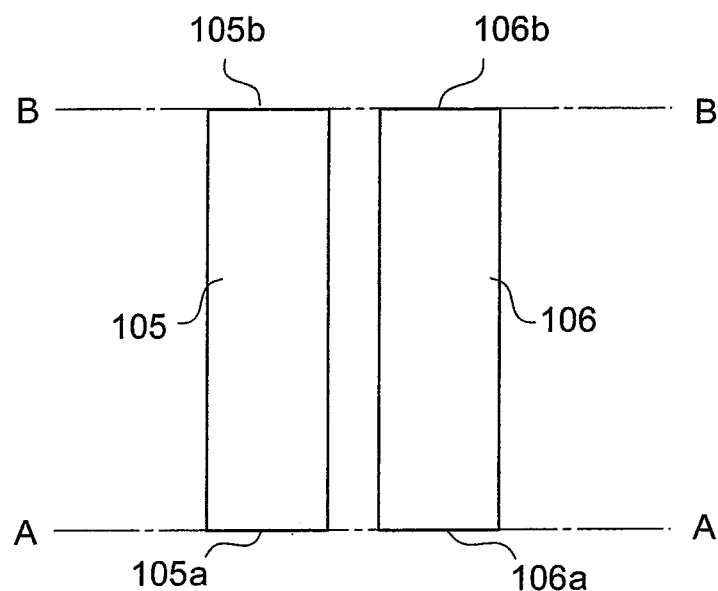
FIG. 9A is a plan view for illustrating a configuration of a power conversion device according to a seventh embodiment of the present invention.
Figure 9B:
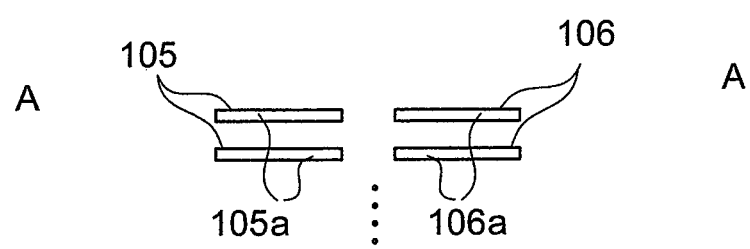
FIG. 9B is an A-A side view for illustrating the configuration of the power conversion device according to the seventh embodiment of the present invention, which is illustrated in FIG. 9A.
Figure 9C:
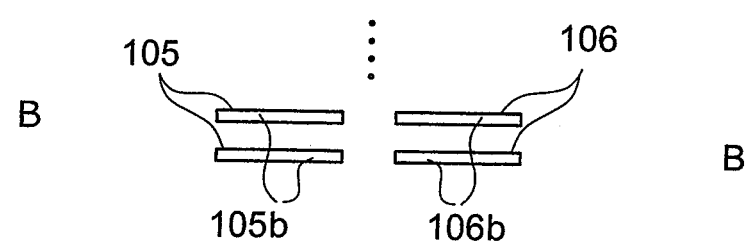
FIG. 9C is a B-B side view for illustrating the configuration of the power conversion device according to the seventh embodiment of the present invention, which is illustrated in FIG. 9A.

FIG. 9A to FIG. 9C are schematic configuration views for illustrating configurations of the first conductor 105 and the second conductor 106 formed in the power conversion device according to the seventh embodiment of the present invention. In the above-mentioned sixth embodiment, the first conductor 105 and the second conductor 106 are each formed of one metal bus bar. The seventh embodiment differs from the sixth embodiment in that the first conductor 105 and the second conductor 106 are each formed of a plurality of laminated metal bus bars. The number of the first conductors 105 and the number of the second conductors 106 are the same.

As illustrated in FIG. 9B and FIG. 9C, in the seventh embodiment, a plurality of first conductors 105 having the same conductor thickness, the same conductor width, and the same conductor length are laminated in the vertical direction. Similarly, a plurality of second conductors 106 having the same conductor thickness, the same conductor width, and the same conductor length are laminated in the vertical direction. Air gaps set in advance are secured between the first conductors 105 and between the second conductors 106.

As described above, in the seventh embodiment, the plurality of first conductors 105 are arranged side by side in the vertical direction with the air gaps secured therebetween, and similarly, the plurality of second conductors 106 are arranged side by side in the vertical direction with the air gaps secured therebetween. Further, as illustrated in FIG. 9A to FIG. 9C, one first conductor 105 and one second conductor 106 form a pair, and the one first conductor 105 and the one second conductor 106 forming each pair are formed in the same layer. In each layer, the first conductor 105 and the second conductor 106 are arranged apart from each other by a distance set in advance so as to be parallel to each other so that the wiring of the first conductor 105 and the wiring of the second conductor 106 are prevented from overlapping each other in the longitudinal direction and the transverse direction. As described above, in the seventh embodiment, in each layer, the first conductor 105 and the second conductor 106 are arranged in the same plane in the space.

Further, the first conductors 105 in the layers are connected to each other at the node 105a and the node 105b, and the first conductors 105 in the layers are electrically connected in parallel to each other. Further, the second conductors 106 in the layers are also connected to each other at the node 106a and the node 106b, and the second conductors 106 in the layers are electrically connected in parallel to each other. Thus, the parasitic capacitance 109 between the first conductor 105 and the second conductor 106 can be decreased while the inductance 105c of the first conductor and the inductance 106c of the second conductor are reduced. The conductors of the layers are connected to each other through direct connection (soldering, welding, or other methods) or with use of a different connection member (screw, conductor, or other members).

In the seventh embodiment as well, similarly to the first to sixth embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed. Further, in the seventh embodiment, the insulating substrate 301 is not provided, and hence the parasitic capacitance 109 can be further decreased.

Further, in the seventh embodiment, the first conductor 105 includes the plurality of laminated conductors, and the second conductor 106 includes the plurality of laminated conductors. The plurality of laminated conductors forming the first conductor 105 are electrically connected in parallel to each other, and the plurality of laminated conductors forming the second conductor 106 are electrically connected in parallel to each other. With this configuration, the combined inductance of the plurality of laminated conductors forming the first conductor 105 and the combined inductance of the plurality of laminated conductors forming the second conductor 106 can be decreased. Thus, the increase of the surge voltage can be further suppressed.

Eighth Embodiment

The overall configuration of a power conversion device according to an eighth embodiment of the present invention is the same as the above-mentioned configuration of the first embodiment illustrated in FIG. 1A.

Figure 10A:
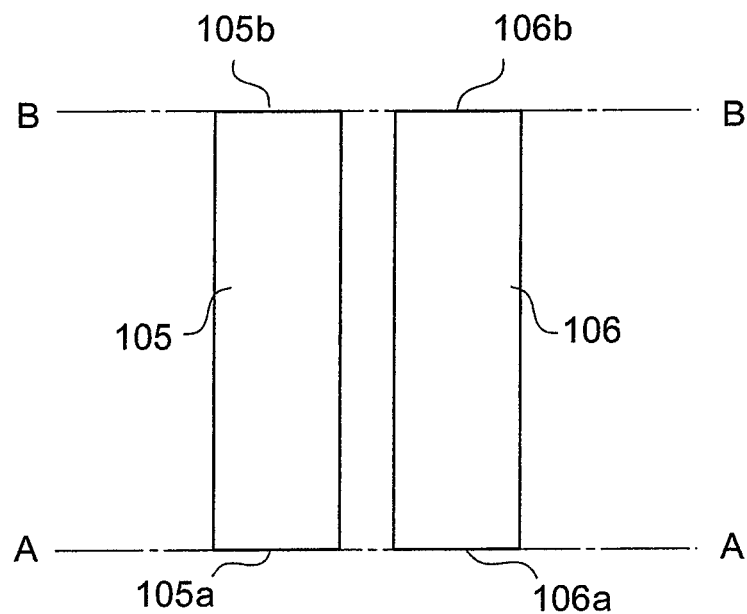
FIG. 10A is a plan view for illustrating a configuration of a power conversion device according to an eighth embodiment of the present invention.
Figure 10B:
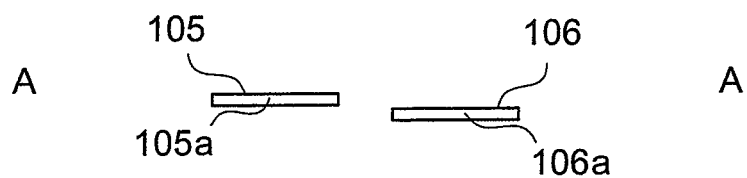
FIG. 10B is an A-A side view for illustrating the configuration of the power conversion device according to the eighth embodiment of the present invention, which is illustrated in FIG. 10A.
Figure 10C:
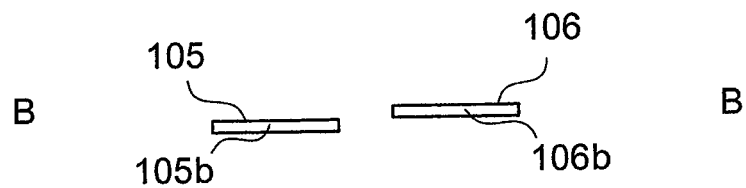
FIG. 10C is a B-B side view for illustrating the configuration of the power conversion device according to the eighth embodiment of the present invention, which is illustrated in FIG. 10A.

FIG. 10A to FIG. 10C are schematic configuration views for illustrating configurations of the first conductor 105 and the second conductor 106 formed in the power conversion device according to the eighth embodiment of the present invention. In the above-mentioned fourth embodiment illustrated in FIG. 6A and FIG. 6B, the first conductor 105 and the second conductor 106 are each wired on the upper surface and the lower surface of the insulating substrate 301. The eighth embodiment differs from the fourth embodiment in that the insulating substrate 301 is not provided, and the first conductor 105 and the second conductor 106 are each formed of a metal bus bar.

In the eighth embodiment, as illustrated in FIG. 10B and FIG. 10C, the first conductor 105 and the second conductor 106 are arranged in different planes that are parallel to each other in a space, and the wiring of the first conductor 105 and the wiring of the second conductor 106 are prevented from overlapping each other in the conductor thickness direction. Further, as illustrated in FIG. 10A, as viewed from above, the first conductor 105 and the second conductor 106 are provided apart from each other by a distance set in advance so as to be parallel to each other so that the wiring of the first conductor 105 and the wiring of the second conductor 106 are prevented from overlapping each other in the conductor transverse direction and the conductor longitudinal direction.

In the eighth embodiment, the insulating substrate 301 is not provided. With this configuration, as compared to the fourth embodiment, the influence of the specific dielectric constant of the insulating substrate 301 is reduced. Therefore, for example, in the case of the same conductor thickness, the same conductor width, and the same conductor length, when the metal bus bars are located in air, the parasitic capacitance 109 between the first conductor 105 and the second conductor 106 can be decreased.

In the eighth embodiment as well, similarly to the first to seventh embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed. Further, in the eighth embodiment, the insulating substrate 301 is not provided, and hence the parasitic capacitance 109 can be further decreased.

Ninth Embodiment

The overall configuration of a power conversion device according to a ninth embodiment of the present invention is the same as the above-mentioned configuration of the first embodiment illustrated in FIG. 1A.

Figure 11A:
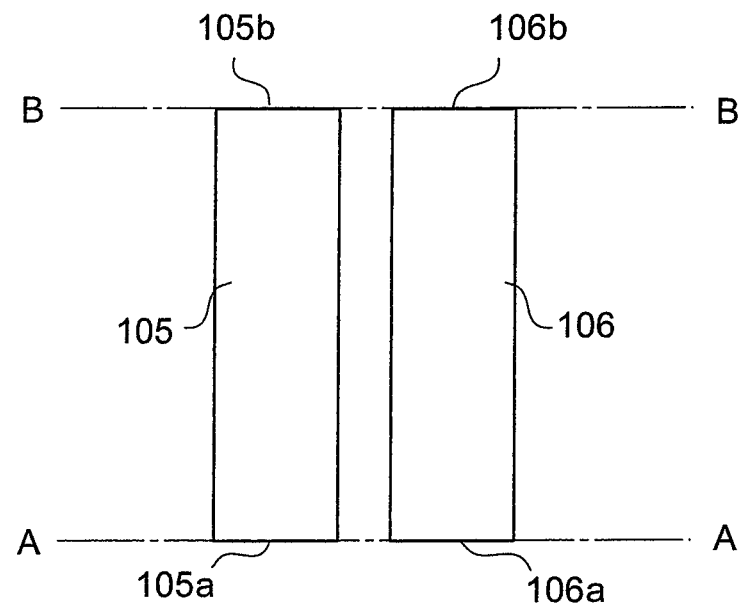
FIG. 11A is a plan view for illustrating a configuration of a power conversion device according to a ninth embodiment of the present invention.
Figure 11B:
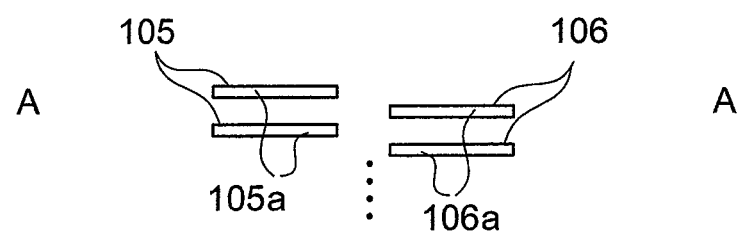
FIG. 11B is an A-A side view for illustrating the configuration of the power conversion device according to the ninth embodiment of the present invention, which is illustrated in FIG. 11A.
Figure 11C:
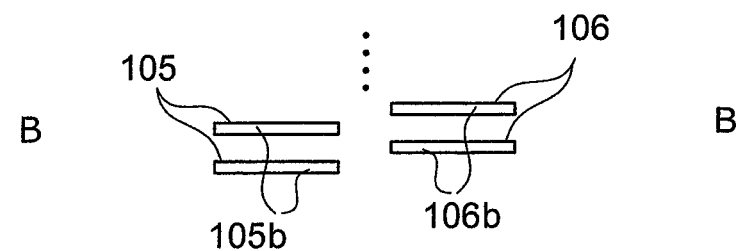
FIG. 11C is a B-B side view for illustrating the configuration of the power conversion device according to the ninth embodiment of the present invention, which is illustrated in FIG. 11A.

FIG. 11A to FIG. 11C are schematic configuration views for illustrating configurations of the first conductor 105 and the second conductor 106 formed in the power conversion device according to the ninth embodiment of the present invention. In the above-mentioned eighth embodiment illustrated in FIG. 10A to FIG. 10C, the first conductor 105 and the second conductor 106 are each formed of one metal bus bar. The ninth embodiment differs from the eighth embodiment in that the first conductor 105 and the second conductor 106 are each formed of a plurality of metal bus bars. In the ninth embodiment, the plurality of first conductors 105 are connected to each other at the node 105a and the node 105b, and the plurality of first conductors 105 are connected in parallel to each other. Further, the plurality of second conductors 106 are also connected to each other at the node 106a and the node 106b, and the plurality of second conductors 106 are connected in parallel to each other. Thus, the parasitic capacitance 109 between the first conductor 105 and the second conductor 106 can be decreased while the inductance 105c of the first conductor and the inductance 106c of the second conductor are reduced.

In the ninth embodiment, as illustrated in FIG. 11B and FIG. 11C, the plurality of first conductors 105 and the plurality of second conductors 106 are arranged in different planes that are parallel to each other in a space, and the wirings of the first conductors 105 and the wirings of the second conductors 106 are prevented from overlapping each other in the conductor thickness direction. Further, as illustrated in FIG. 11A, as viewed from above, the first conductor 105 and the second conductor 106 are arranged apart from each other by a distance set in advance so as to be parallel to each other so that the wiring of the first conductor 105 and the wiring of the second conductor 106 are prevented from overlapping each other in the conductor transverse direction and the conductor longitudinal direction.

In the ninth embodiment as well, similarly to the first to eighth embodiments, the first conductor 105 and the second conductor 106 are arranged so as to be parallel to each other along the longitudinal direction of each of the first conductor 105 and the second conductor 106 so that the first conductor 105 and the second conductor 106 are prevented from overlapping each other in the longitudinal direction and the transverse direction of each of the first conductor 105 and the second conductor 106. In this manner, the parasitic capacitance 109 to be generated between the first conductor 105 and the second conductor 106 is decreased, and hence the impedance Z of the parasitic capacitance 109 is increased. Thus, a current is less liable to flow through the inductance 105c of the first conductor 105 and the inductance 106c of the second conductor 106, which are connected in series to the parasitic capacitance 109. Therefore, the increase of the surge voltage due to the influence of the inductance 105c and the inductance 106c can be suppressed. Further, in the ninth embodiment, the insulating substrate 301 is not provided, and hence the parasitic capacitance 109 can be further decreased.

Further, in the ninth embodiment, the first conductor 105 includes the plurality of laminated conductors, and the second conductor 106 includes the plurality of laminated conductors. The plurality of laminated conductors forming the first conductor 105 are electrically connected in parallel to each other, and the plurality of laminated conductors forming the second conductor 106 are electrically connected in parallel to each other. With this configuration, the combined inductance of the plurality of laminated conductors forming the first conductor 105 and the combined inductance of the plurality of laminated conductors forming the second conductor 106 can be decreased. Thus, the increase of the surge voltage can be further suppressed.

Tenth Embodiment

Figure 12B:
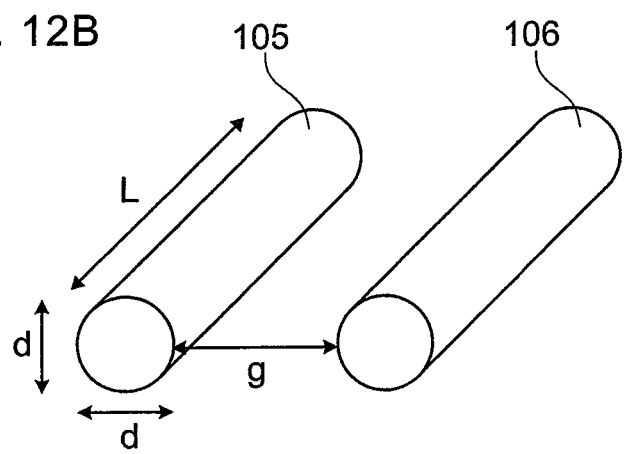
FIG. 12B is a perspective view for illustrating another example of the shapes of the first conductor and the second conductor in the power conversion device according to the tenth embodiment of the present invention.
Figure 12C:
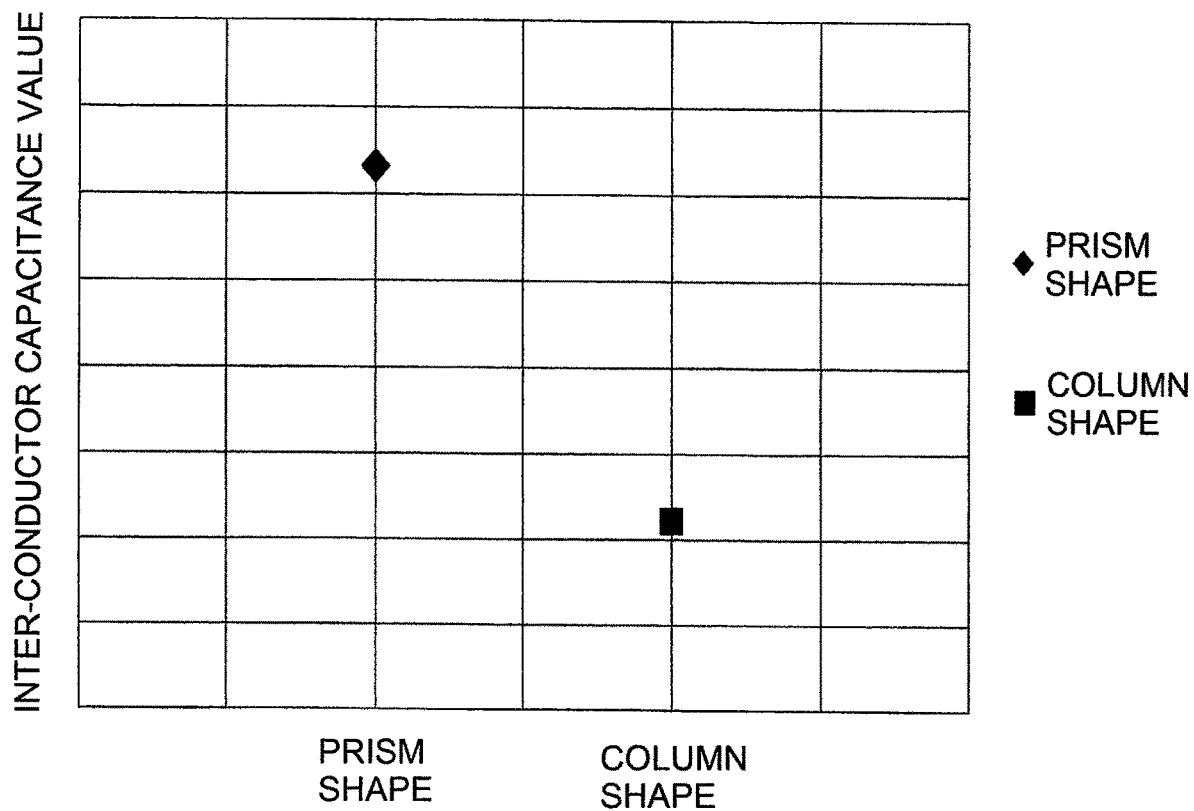
FIG. 12C is a graph for showing an inter-conductor capacitance value of the conductors illustrated in FIG. 12A and FIG. 12B.

In the above-mentioned sixth to ninth embodiments, the first conductor 105 and the second conductor 106 are formed of plate-like or prism-shaped metal bus bars, but as illustrated in FIG. 12B, when the first conductor 105 and the second conductor 106 are formed of column-shaped metal bus bars, the parasitic capacitance between the conductors can be further decreased. As an example, FIG. 12C is a graph for showing results of comparing the capacitance between the two conductors having the column shape and the capacitance between the two conductors having the prism shape. In the prism shape, two metal conductors each having a width d, a height d, and a length L are arranged apart from each other by a distance g. In the column shape, similarly to the prism shape, two metal conductors each having a width d, a height d, and a length L are arranged apart from each other by a distance g. As shown in FIG. 12C, it is found that, when the first conductor 105 and the second conductor 106 are formed into a column shape, the parasitic capacitance 109 between the first conductor 105 and the second conductor 106 is decreased.

Figure 13:
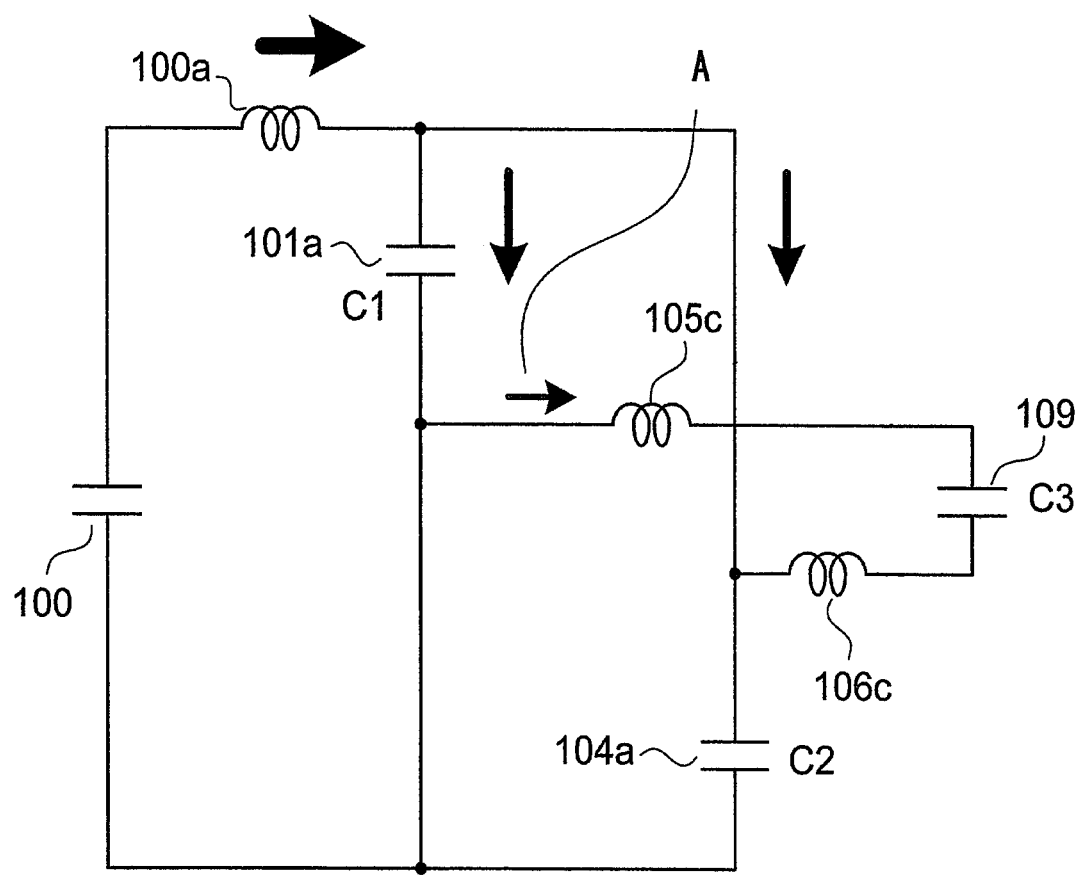
FIG. 13 is a diagram for illustrating an equivalent circuit of the power conversion devices according to the first to tenth embodiments of the present invention.

Further, in the above-mentioned first to tenth embodiments, as illustrated in FIG. 13, the parasitic capacitance 109 between the first conductor 105 and the second conductor 106 is set to be smaller than the parasitic capacitances 101a to 104a of the first to fourth switching elements 101 to 104. That is, in FIG. 13, C1>C3 and C2>C3 are satisfied. In this manner, when the first switching element 101 and the fourth switching element 104 are turned off, the impedance of the parasitic capacitance 109 is larger than the impedances of the parasitic capacitance 101a of the first switching element 101 and the parasitic capacitance 104a of the fourth switching element 104. Therefore, as indicated by an arrow A, a current is less liable to flow through the parasitic capacitance 109, and the increase of the surge voltage due to the inductance 105c of the first conductor 105 and the inductance 106c of the second conductor 106, which are connected in series to the parasitic capacitance 109, can be suppressed. A similar effect can be obtained also when the second switching element 102 and the third switching element 103 are turned off.

Figure 14:
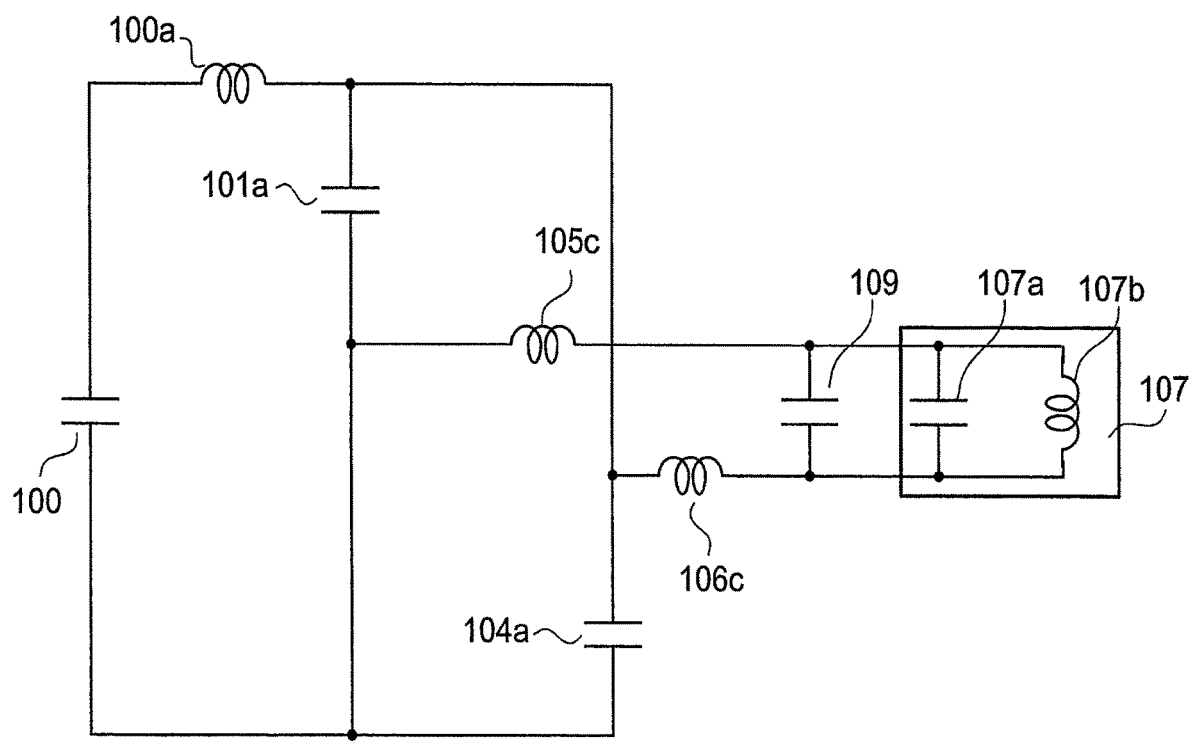
FIG. 14 is a diagram for illustrating an equivalent circuit of the power conversion devices according to the first to tenth embodiments of the present invention.

Next, FIG. 14 is a diagram for illustrating an equivalent circuit including a leakage inductance of the first winding side of the isolation transformer 107 and a line capacitance of the first winding of the isolation transformer. In FIG. 14, a line capacitance 107a is generated in the first winding of the isolation transformer 107, and the isolation transformer 107 has a primary leakage inductance 107b. In this case, resonance occurs at a frequency of $fr=1/(2\pi\sqrt{(LC)})$ because of the leakage inductance 107b and a combined capacitance of the line capacitance 107a of the first winding of the isolation transformer 107 and the parasitic capacitance 109 between the first conductor 105 and the second conductor 106. At this time, the frequency component included in the surge voltage is amplified by the resonance frequency fr to become a noise. Particularly in automobiles, the noise is transmitted to a harness or other members to cause influence in the AM radio band or the FM radio band.

The AM radio band and the FM radio band have limit values of MW 0.53 MHz to 1.8 MHz, which corresponds to the AM radio band, and FM 76 MHz to 108 MHz, which corresponds to the FM radio band, defined in CISPR25 of CISPR (International Special Committee On Radio Interference), which is an international standard.

In view of this, in the above-mentioned first to tenth embodiments, the parasitic capacitance 109 between the first conductor 105 and the second conductor 106, which is represented by Cp1, satisfies one of the following expressions:

$$Cp1>1/((2\pi\times0.53\times10^6)^2\times Lr1)-Ctr1;$$

$$1/((2\pi\times1.8\times10^6)^2\times Lr1)-Ctr1>Cp1>1/((2\pi\times76\times10^6)^2\times Lr1)-Ctr1;\text{ and}$$

$$1/((2\pi\times108\times10^6)^2\times Lr1)-Ctr1>Cp1,$$

where Cp1 represents the parasitic capacitance 109 between the first conductor 105 and the second conductor 106, Ctr1 represents the line capacitance 107a of the first winding of the isolation transformer, and Lr1 represents the leakage inductance 107b to be generated on the first winding side of the isolation transformer 107. In this manner, the resonance frequency fr can be shifted to a frequency outside of the AM band and the FM band, and thus the limit values of the CISPR standard can be satisfied.

In the above-mentioned first to tenth embodiments, MOSFETs are used as the first to fourth switching elements 101 to 104, but IGBTs or other switching elements may be used instead.

Further, the third conductor 205 and the fourth conductor 206, which are two conductors connecting the fifth to eighth switching elements 201 to 204 to both the ends of the second winding of the isolation transformer 107, are formed to have configurations similar to those of the first conductor 105 and the second conductor 106 illustrated in each of the first to ninth embodiments. In this manner, the effect of reducing the surge voltage can be obtained. In this case, it is only required that the third conductor 205 be formed to have the same configuration as that of the first conductor 105 illustrated in each of the first to ninth embodiments, and that the fourth conductor 206 be formed to have the same configuration as that of the second conductor 106 illustrated in each of the first to ninth embodiments, and hence description thereof is omitted herein.

Further, when the parasitic capacitance 209 between the third conductor 205 and the fourth conductor 206 is set to be smaller than the parasitic capacitances (junction capacitances) 201a to 204a of the fifth to eighth switching elements 201 to 204, the increase of the surge voltage can be more effectively suppressed.

Further, the parasitic capacitance 209 between the third conductor 205 and the fourth conductor 206, which is represented by Cp2, satisfies one of the following expressions:

$$Cp2>1/((2\pi\times0.53\times10^6)^2\times Lr2)-Ctr2;$$

$$1/((2\pi\times1.8\times10^6)^2\times Lr2)-Ctr2>Cp2>1/((2\pi\times76\times10^6)^2\times Lr2)-Ctr2;$$

and $$1/((2\pi\times108\times10^6)^2\times Lr2)-Ctr2>Cp2,$$

where Lr2 represents a leakage inductance to be generated on the second winding side of the isolation transformer 107, and Ctr2 represents a line capacitance of the second winding of the isolation transformer 107. In this manner, the limit values of the CISPR standard can be satisfied.

In the above-mentioned first to tenth embodiments, diodes are used for the fifth to eighth switching elements 201 to 204 connected to both the ends of the second winding of the isolation transformer 107, but MOSFETs or other switching elements may be used instead.

Figure 15:
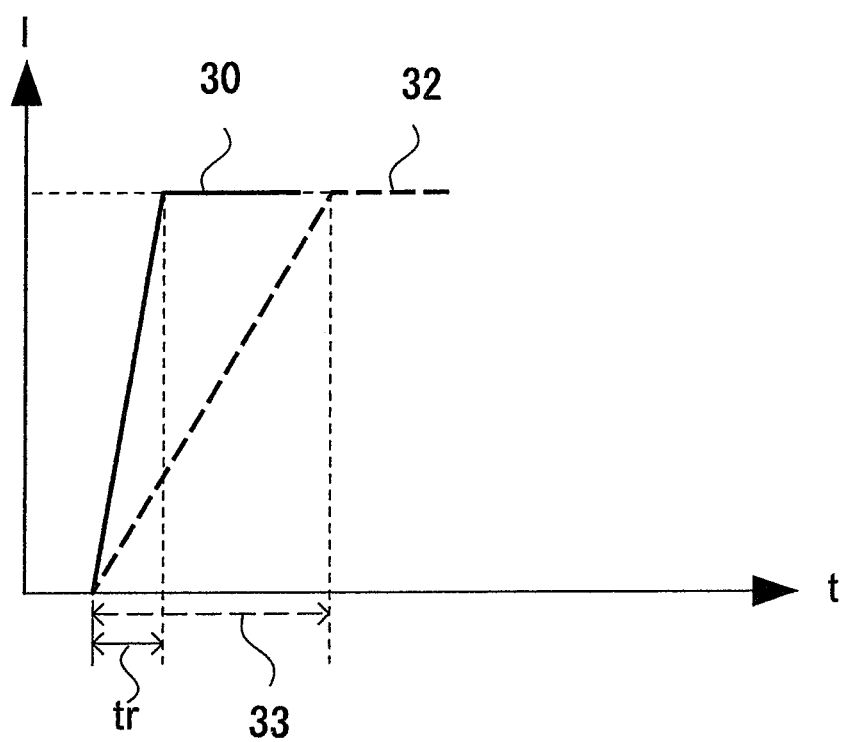
FIG. 15 is a characteristic graph for showing current change exhibited when wide bandgap semiconductors are used as switching elements in the power conversion devices according to the first to tenth embodiments of the present invention.

Further, in the above-mentioned first to tenth embodiments, as the first to fourth switching elements 101 to 104 and the fifth to eighth switching elements 201 to 204, wide bandgap semiconductors may be used to achieve high-speed and high-frequency drive. However, as indicated by reference symbol 30 in FIG. 15, along with the increase in speed, a pulse rising time tr becomes very shorter as compared to the rising time tr in the related art as indicated by reference symbol 33. As a result, di/dt becomes very large. In FIG. 15, reference symbol 30 represents a case in which wide bandgap semiconductors are used, and reference symbol 32 represents the related-art case. Therefore, the surge voltage is increased by L×di/dt even with a slight wiring inductance. The effect of reducing the surge voltage can be obtained by applying the present invention to a power conversion device in which wide bandgap semiconductors are used for the switching elements. Therefore, the first to tenth embodiments are suitable for applying the wide bandgap semiconductors to the switching elements.

In the above-mentioned first to tenth embodiments, an in-vehicle power conversion device is described as the power conversion device, but the present invention is not limited thereto. The present invention is applicable to a general power conversion device including an isolation transformer.

Further, in the present invention, the embodiments may be freely combined with each other, or any components of the embodiments may be appropriately changed or omitted without departing from the scope of the present invention.

The invention claimed is:

1. A power conversion device, comprising:
   an isolation transformer including a first winding and a second winding;
   switching elements to be connected to the first winding of the isolation transformer;
   a first conductor comprising a first node configured to connect to one end of the first winding of the isolation transformer and a second node configured to connect to an electrode of the switching elements; and
   a second conductor comprising a third node configured to connect another end of the first winding of the isolation transformer and a fourth node configured to connect to another electrode of the switching elements, the first conductor and the second conductor being arranged in parallel to each other along a longitudinal direction of each of the first conductor and the second conductor, wherein the first conductor and the second conductor do not overlap in the longitudinal direction and a transverse direction of each of the first conductor and the second conductor,
   wherein an entire length of the first conductor that extends from the first node to the second node is parallel to an entire length of the second conductor that extends from the third node to the fourth node.

2. The power conversion device according to claim 1, wherein the first conductor and the second conductor are arranged in the same plane.

3. The power conversion device according to claim 1, wherein the first conductor and the second conductor are arranged in different planes that are parallel to each other.

4. The power conversion device according to claim 1, wherein the first conductor includes a plurality of laminated conductors, and
   wherein the plurality of laminated conductors forming the first conductor are connected in parallel to each other via through holes.

5. The power conversion device according to claim 1, wherein the second conductor includes a plurality of laminated conductors, and
   wherein the plurality of laminated conductors forming the second conductor are connected in parallel to each other via through holes.

6. The power conversion device according to claim 1, wherein a capacitance between the first conductor and the second conductor is smaller than a parasitic capacitance of each of the switching elements.

7. The power conversion device according to claim 1, wherein a capacitance between the first conductor and the second conductor satisfies the following relationship:

$$Cp1 > 1/((2\pi \times 0.53 \times 10^6)^2 \times Lr1) - Ctr1;$$

where $Cp1$ represents the capacitance between the first conductor and the second conductor, $Lr1$ represents a leakage inductance to be generated on the first winding side of the isolation transformer, and $Ctr1$ represents a line capacitance of the first winding of the isolation transformer.

8. The power conversion device according to claim 1, wherein a capacitance between the first conductor and the second conductor satisfies the following relationship:

$$1/((2\pi \times 1.8 \times 10^6)^2 \times Lr1) - Ctr1 > Cp1 > 1/((2\pi \times 76 \times 10^6)^2 \times Lr1) - Ctr1;$$

where $Cp1$ represents the capacitance between the first conductor and the second conductor, $Lr1$ represents a leakage inductance to be generated on the first winding side of the isolation transformer, and $Ctr1$ represents a line capacitance of the first winding of the isolation transformer.

9. The power conversion device according to claim 1, wherein a capacitance between the first conductor and the second conductor satisfies the following relationship:

$$1/((2\pi \times 108 \times 10^6)^2 \times Lr1) - Ctr1 > Cp1,$$

where $Cp1$ represents the capacitance between the first conductor and the second conductor, $Lr1$ represents a leakage inductance to be generated on the first winding side of the isolation transformer, and $Ctr1$ represents a line capacitance of the first winding of the isolation transformer.

10. The power conversion device according to claim 1, wherein each of the switching elements includes a wide bandgap semiconductor.

* * * * *